US005689571A

United States Patent [19]

Kitamura

[11] Patent Number: 5,689,571

[45] Date of Patent: Nov. 18, 1997

[54] DEVICE FOR PRODUCING REVERBERATION SOUND

[75] Inventor: Mineo Kitamura, Hamamatsu, Japan

[73] Assignee: Kawai Musical Inst. Mfg. Co., Ltd., Hamamatsu, Japan

[21] Appl. No.: 569,605

[22] Filed: Dec. 8, 1995

[30] Foreign Application Priority Data

Dec. 8, 1994 [JP] Japan .................................... 6-305249
Dec. 8, 1994 [JP] Japan .................................... 6-305250

[51] Int. Cl.$^{6}$ .................................... H03G 3/00

[52] U.S. Cl. .................................... 381/63; 84/630

[58] Field of Search .................................... 381/61, 63, 62, 381/64, 65; 84/630, 629, DIG. 26, 663, 658

[56] References Cited

U.S. PATENT DOCUMENTS 4,350,072 9/1982 Deutsch .................................... 84/1.24
5,272,274 12/1993 Kimura .................................... 381/63
5,369,710 11/1994 Asai .................................... 381/63
5,371,799 12/1994 Lowe et al. .................................... 381/63
5,386,529 1/1995 Kondo .................................... 381/63
5,464,947 11/1995 Kitamura .................................... 84/624
5,526,431 6/1996 Shioda .................................... 381/63

FOREIGN PATENT DOCUMENTS 57-181598 11/1982 Japan .
2-93693 4/1990 Japan .
3-174590 7/1991 Japan .
4-181997 6/1992 Japan .
6-195074 7/1994 Japan .
7-248764 9/1995 Japan .

*Primary Examiner*—Curtis Kuntz
*Assistant Examiner*—Vivian Chang

[57] ABSTRACT

Early reflection sounds and subsequent reverberation sounds are processed in different modes by separate processing devices in order to obtain reverberation effects close to those of natural sound as well as to freely produce reverberation effects that do not exist in natural sound. When the early reflection sound overlaps the subsequent reverberation sound in time, the early reflection sound and the subsequent reverberation sound are produced without noise. There is no need to omit either one of them. Besides, complex envelope control is executed for the early reflection sound, and the envelope levels are weighted and fluctuated. Therefore, it is possible to establish a highly sophisticated sound field.

25 Claims, 29 Drawing Sheets

80

MUSICAL FACTOR

| ATTACK | DECAY | SUSTAIN | RELEASE |
|---|---|---|---|
| MT ES | MT ES | MT ES | MT ES |
| MT ES | MT ES | MT ES | MT ES |
| MT ES | MT ES | MT ES | MT ES |
| ⋮ | ⋮ | ⋮ | ⋮ |

DEVICE FOR PRODUCING REVERBERATION SOUND

BACKGROUND OF THE INVENTION

1. Field of the Invention

The present invention relates to a device for producing (generating) reverberation sound and, particularly, to a device for producing (generating) early reflection sound and subsequent reverberation sound by using separate processing devices and based upon different processing modes. The invention further relates to a device for executing a variety of sophisticated acoustic effect processings for the early reflection sound.

2. Description of the Related Art

The sound produced by struck string instruments such as piano and the like contains direct sound, early reflection sound and reverberation sound in a mixed manner. The direct sound is produced first by the vibration of a string. The early reflection sound is reflected by the inner walls of an enclosure of the strings and is emitted to the external side. The reverberation sound is reflected by the walls in a room in which the musical instrument is placed. Therefore, previous electronic musical instruments have heretofore been so designed as to artificially produce the early reflection sound and the reverberation sound. Therefore, the sound produced by an electronic musical instrument has reverberation effect close to that of natural acoustics.

The present applicant has previously disclosed in Japanese Patent Application No. 38608/1994 a device for producing reverberation sound that contains early reflection sound. This device reads sample data of acoustic data of the original sound that corresponds to the direct sound and produces reverberation sound based upon the sound data. At this moment, the content of address calculation is changed. This makes it possible to freely change the time interval for producing reverberation sound and the quantity of attenuation.

According to the above-mentioned device, the early reflection sound and the subsequent reverberation sound are processed by using a single processing device and based upon the same processing mode. Here, the subsequent reverberation sound is the reverberation sound other than the early reflection sound, and the processing mode stands for calculations of delay times, attenuation characteristics and filter characteristics etc.. Further, the processing device stands for an arithmetic processing device such as microprocessor, digital signal processor or the like processor.

In natural sound, the early reflection sound has a close relationship relative to the sound effect. Therefore, the early reflection sound must be distinguished from the subsequent reverberation sound. Besides, the early reflection sound is produced in a plural number at different times and having different amplitude levels. In order to obtain a reverberation effect close to that of natural sound, therefore, it is necessary to distinguish the early reflection sound from the subsequent reverberation sound and treat them based upon different processing modes.

In particular, the early reflection sound is produced within a very short delay time after the production of the direct sound. Therefore, a processing for producing the early reflection sound must be executed at a high speed. When the timing of producing the early reflection sound overlaps the timing of producing the head sound of the subsequent reverberation sound, the data must be processed in increased amounts. In this case, it is difficult to process the early reflection sound and the subsequent reverberation sound using a single processing device. In order to freely obtain a reverberation effect that does not exist in natural sound, furthermore, the early reflection sound and the subsequent reverberation sound must be processed being separated from each other.

The early reflection sound plays an important role: it imparts width of sound to the direct sound and increases vividness. Therefore, a change in the early reflection sound seriously affects the artificial sound effect. According to the above-mentioned conventional device, however, the early reflection sound and the subsequent reverberation sound are produced by using a single processing device. In the conventional device, therefore, the processing of the subsequent reverberation sound must be decreased accordingly to increase the data of the early reflection sound, such that noises are generated.

SUMMARY OF THE INVENTION

The present invention was accomplished in order to solve the above-mentioned problems, and its object is to obtain reverberation effect close to that of natural sound and to freely establish reverberation effect that does not exist in natural sound. A further object of the present invention is to execute a variety of sound effect processings for the early reflection sound to obtain a sophisticated acoustic effect without lacking processing ability.

In order to achieve these objects according to the present invention, the early reflection sound and the subsequent reverberation sound are produced (generated) in different processing modes. Here, the mode stands for delay times, attenuation characteristics, filter characteristics, attenuation threshold values and address threshold values etc.. The early reflection sound stands for reverberated echo and the like that are generated within very short periods of time after the generation of the original sound (direct sound), and the subsequent reverberation sound stands for reverberated echo and the like that can be heard following the early reflection sound.

Therefore, no noise is generated even when the processing for producing the subsequent reflected sound overlaps in time with the processing for producing the early reflection sound. Therefore, the early reflection sound and the subsequent reflected sound are reliably produced (generated). Further, it possible to obtain reverberation effect close to that of natural sound, and to freely establish reverberation effect that does not exist in natural sound.

The present invention further controls an envelope of the early reflection sound or the subsequent reflected sound. A change in the early reflection sound is greatly reflected by the sound effect. By adding envelope control and weighting of the early reflection sound or by adding fluctuation effect, therefore, there is established sophisticated sound field feeling that could not be realized so far. The present invention further executes a variety of processings for the early reflection sound at high speeds without lacking processing ability.

PROC: PROCESSING, COEF: COEFFICIENT, No: NUMBER,

REVE: REVERBERATION ATT: ATTENUATION, THR: THRESHOLD

FLUC: FLUCTUATION.

DESCRIPTION OF TEE PREFERRED EMBODIMENTS

Summary of the Embodiments

Figure 1:
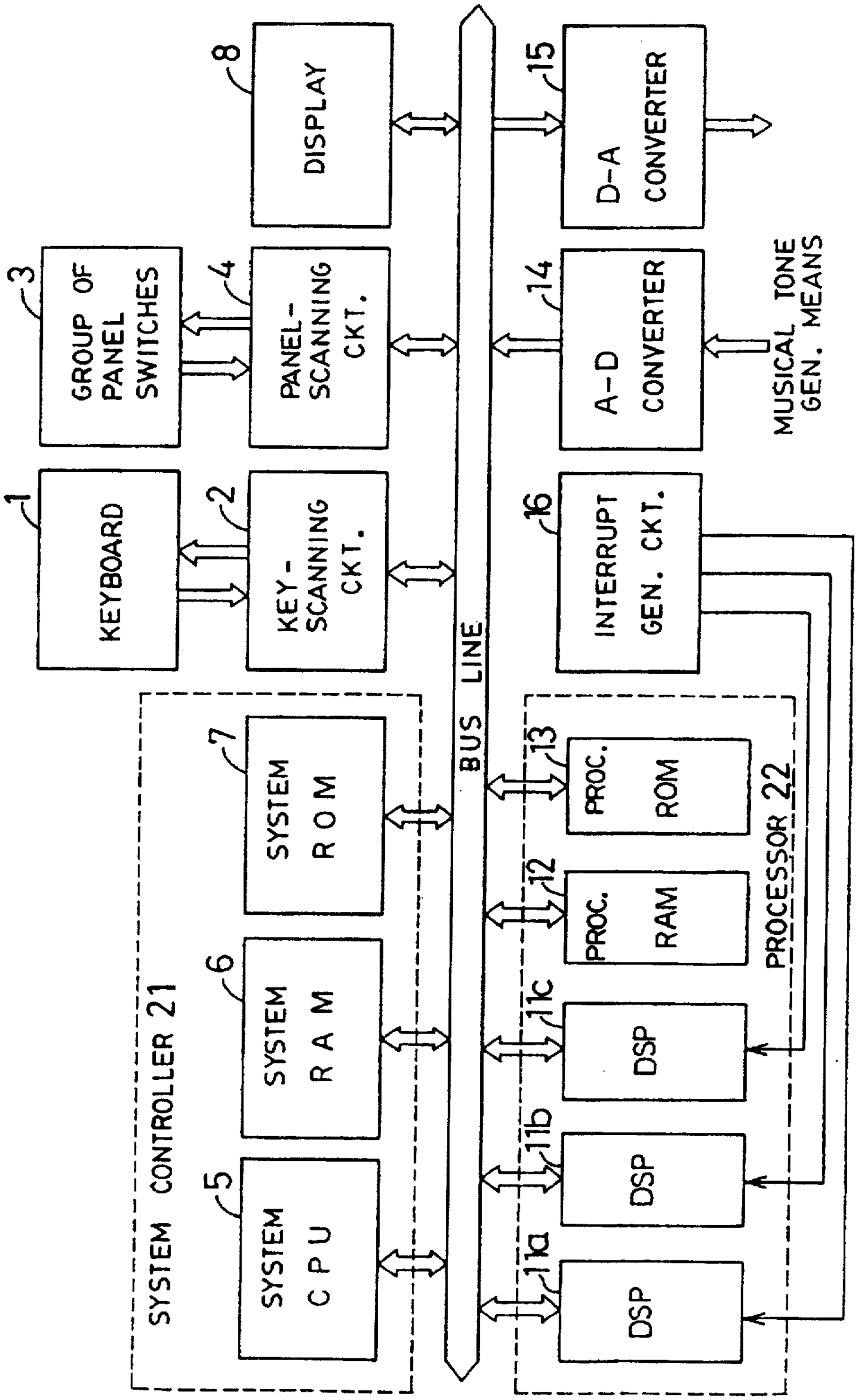
FIG. 1 is a circuit diagram illustrating an electronic sound device as a whole.

Referring to FIG. 1, an electronic sound device is provided with three digital signal processors 11*a*, 11*b* and 11*c*. The first digital signal processor 11*a* produces a first early reflection sound R1. The second digital signal processor 11*b* produces a second early reflection sound R2. The third digital signal processor 11*c* produces a subsequent reverberation sound P. A processor 22 controls delay times D1, D2 and amplitude levels of the early reflection sounds R1, R2. The subsequent reverberation sound P is formed (generated) by two kinds of reverberation sounds G and J which are repetitively produced (generated) having different attenuation factors and delay times.

As shown in FIGS. 19, 20, 22 and 23, furthermore, these early reflection sounds R1, R2 and the subsequent reverberation sounds G, J are output after having been subjected to the envelope control, weighting, fluctuation control and delay processing.

1. Whole Circuit (First Embodiment)

FIG. 1 is a diagram illustrating a whole circuit of the electronic sound device. Keys of a keyboard 1 are used for generating and extinguishing musical tones. A key-scanning circuit 2 scans the keys. Key-on and key-off are detected by the key-scanning circuit 2. The key-operation data are written into a system RAM 6 by a system CPU 5. The system CPU 5 compares the key-operation data with on/off data of the keys stored in the system RAM 6, and whereby on-event and off-event of the keys are discriminated.

The keyboard 1 can be replaced by an electronic string instrument, an electronic wind (reed) instrument, an electronic percussion (pad) or a keyboard of a computer. The key-scanning circuit 2 detects key-on, key-off and pitch of the keyboard 1 and, further, detects touch data TC.

A panel-scanning circuit 4 scans the switches of a group of panel switches 3 to detect on/off of the switches. The switch operation-data are written into the system RAM 6 by the system CPU 5. The system CPU 5 compares the switch operation-data with on/off data of the switches stored in the system RAM 6, and whereby on-event and off-event of the switches are discriminated. The group of panel switches 3 is provided with switches for controlling a variety of musical tones. A display 8 displays the contents of control determined by manipulating the switches.

The system RAM 6 stores a variety of data processed by the system CPU 5 and a variety of data necessary for the processing. A system ROM 7 stores a program executed by the system CPU 5 and other processing programs. A system controller 21 includes the system CPU 5, system RAM 6 and system ROM 7. The system controller 21 may be a single chip equipped with the system CPU 5, system RAM 6 and system ROM 7, or a one-chip microcomputer in which RAM and ROM are integrated in one chip.

The digital signal processors 11*a*, 11*b* and 11*c* in the processor 22 execute the arithmetic processing and generate various data in a time-sharing manner. The various data include, for example, sound data SD, tone waveform data, envelope data, frequency modulation data, amplitude modulation data, weighting data, address data, filter characteristics data and the like. The sound data SD includes the data of early reflection sound and subsequent reverberation sound. A processing ROM 13 stores programs of arithmetic processings executed by the digital signal processors 11a, 11b, 11c and programs for executing other processings.

The processing RAM 12 stores various data processed by the digital signal processors 11a, 11b, 11c and various data necessary for the processings. The processing RAM 12 is a work memory for producing the early reflection sound and the subsequent reverberation sound. An interrupt-generating circuit 16 is connected to the digital signal processors 11a, 11b, 11c, so that an interrupt signal INT is input thereto after every after a predetermined period of time. The interrupt signal INT works to start a sub-routine that will be described later. The interrupt-generating circuit 16 is a programmable timer, a clock generator or the like. The interrupt signal INT is a timer signal or a clock signal produced (generated) after every predetermined period.

Analog tone waveform signals and other analog sound signals are input to an A-D converter 14 where they are converted into digital sound data. Digital sound data SD are written into the processing RAM 12 by the digital signal processor 11a. The digital signal processors 11a, 11b and 11c execute arithmetic operation, and sound data SD are read out from the processing RAM 12 depending upon the result of operation. The sound data SD are sent to a D-A converter 15. Digital tone waveform signals and other digital sound data SD are input to the D-A converter 15 and are converted into analog signals. The analog signals output from the D-A converter 15 are sent, via an amplifier, to a speaker to generate musical tones.

2. Digital Signal Processors 11a, 11b, 11c (First Embodiment)

Figure 2:
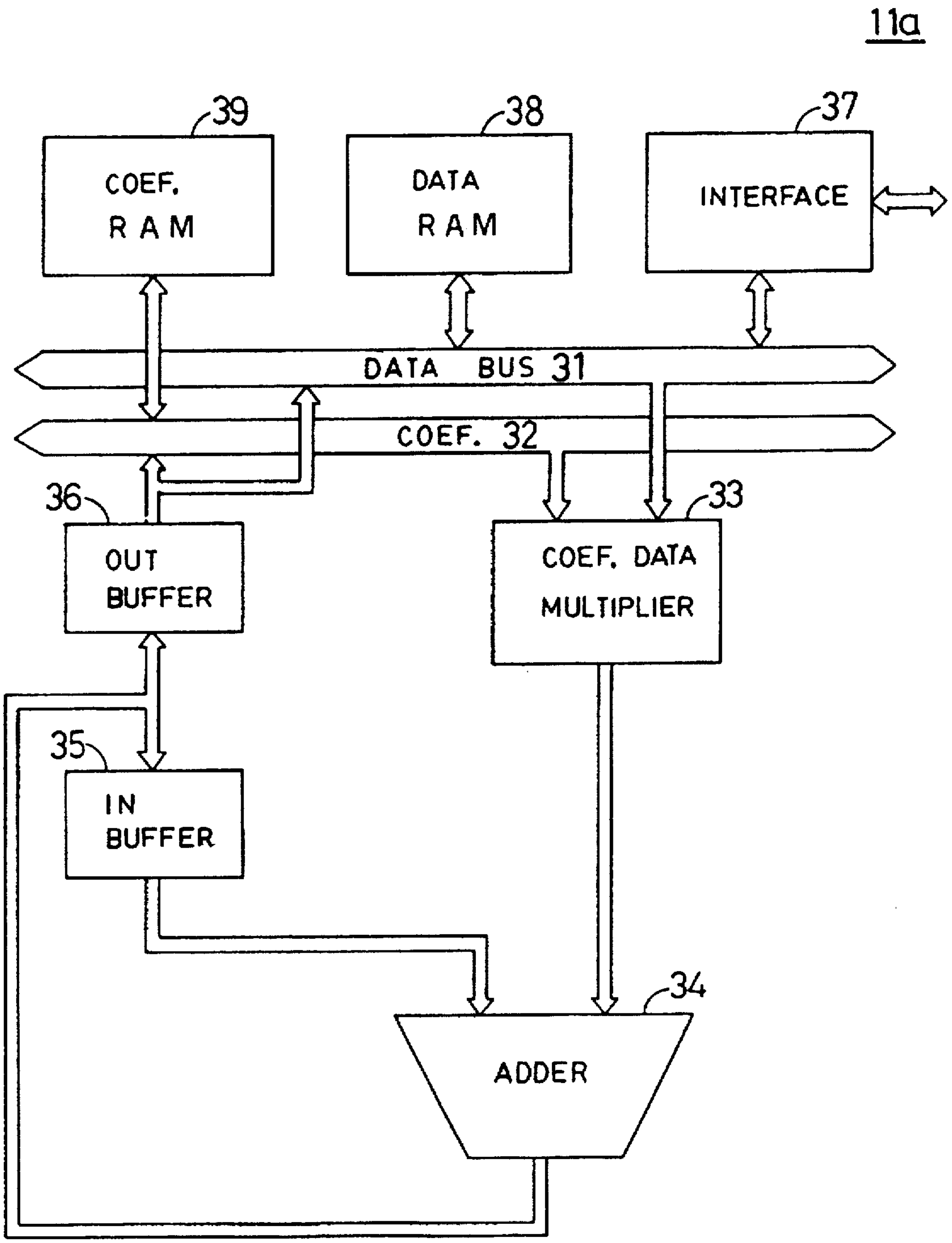
FIG. 2 is a circuit diagram of a digital signal processor 11*a*.

FIG. 2 is a circuit diagram of the digital signal processor 11a. Circuits of other digital signal processors 11b and 11c are the same as the circuit of FIG. 2. The digital signal processor 11a is provided with a data bus line 31 and a coefficient bus line 32. To the data bus line 31, data are fed from an out-buffer 36 and a data RAM 38 or an interface 37. To the coefficient bus line 32, coefficients are fed from the out-buffer 36 or a coefficient RAM 39.

The data fed to the data bus line 31 and the coefficient fed to the coefficient bus line 32 are multiplied by each other through a multiplier 33, added through an adder 34 to the data from an in-buffer 35, and are written into the out-buffer 36 or into the in-buffer 35. The data of the out-buffer 36 are fed to the data bus line 31 or to the coefficient bus line 32. The data of the data bus line 31 are output to an external unit via the interface 37 or are fed to the multiplier 33 or to the data RAM 38. The data of the coefficient bus line 32 are fed to the multiplier 33 or to the coefficient RAM 39.

3. Early Reflection Sound and Subsequent Reverberation Sound (First Embodiment)

Figure 3:
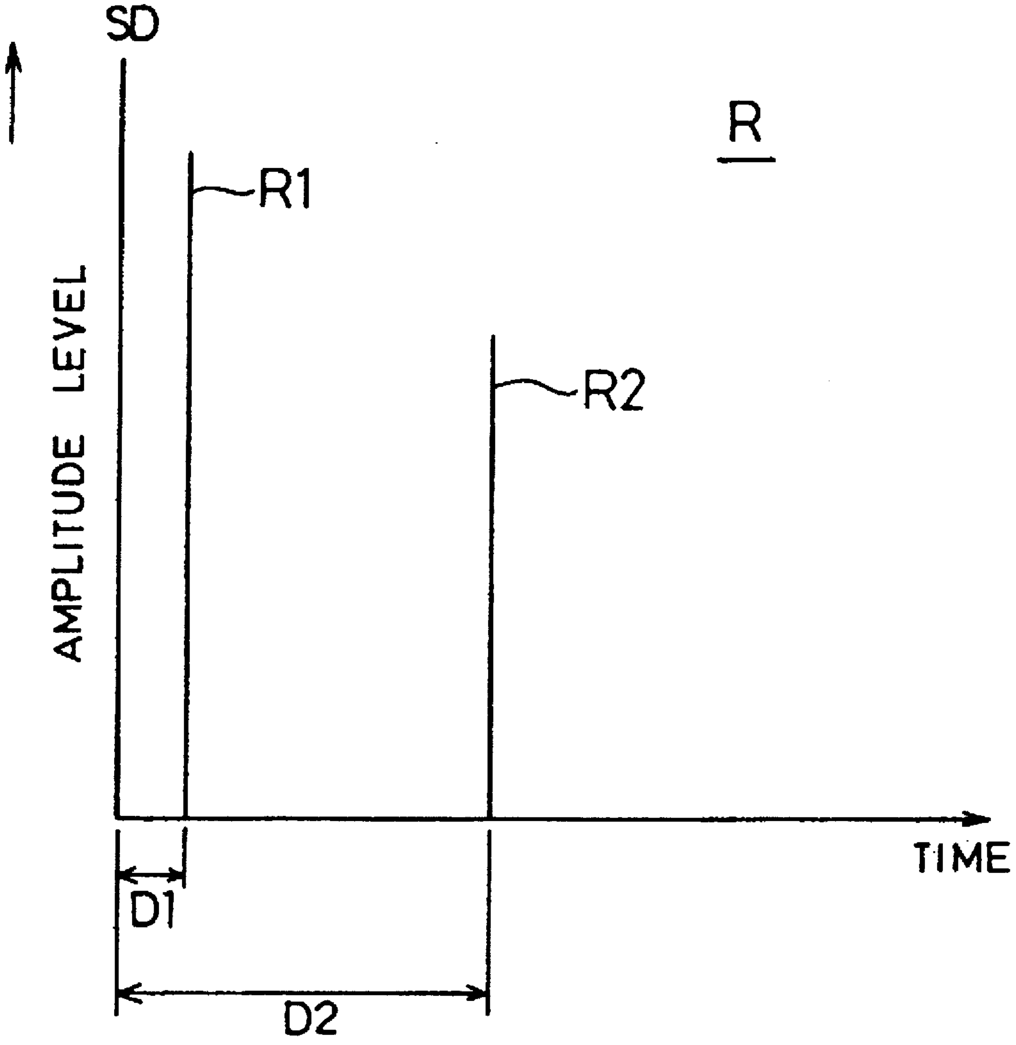
FIG. 3 illustrates early reflection sound.
Figure 4:
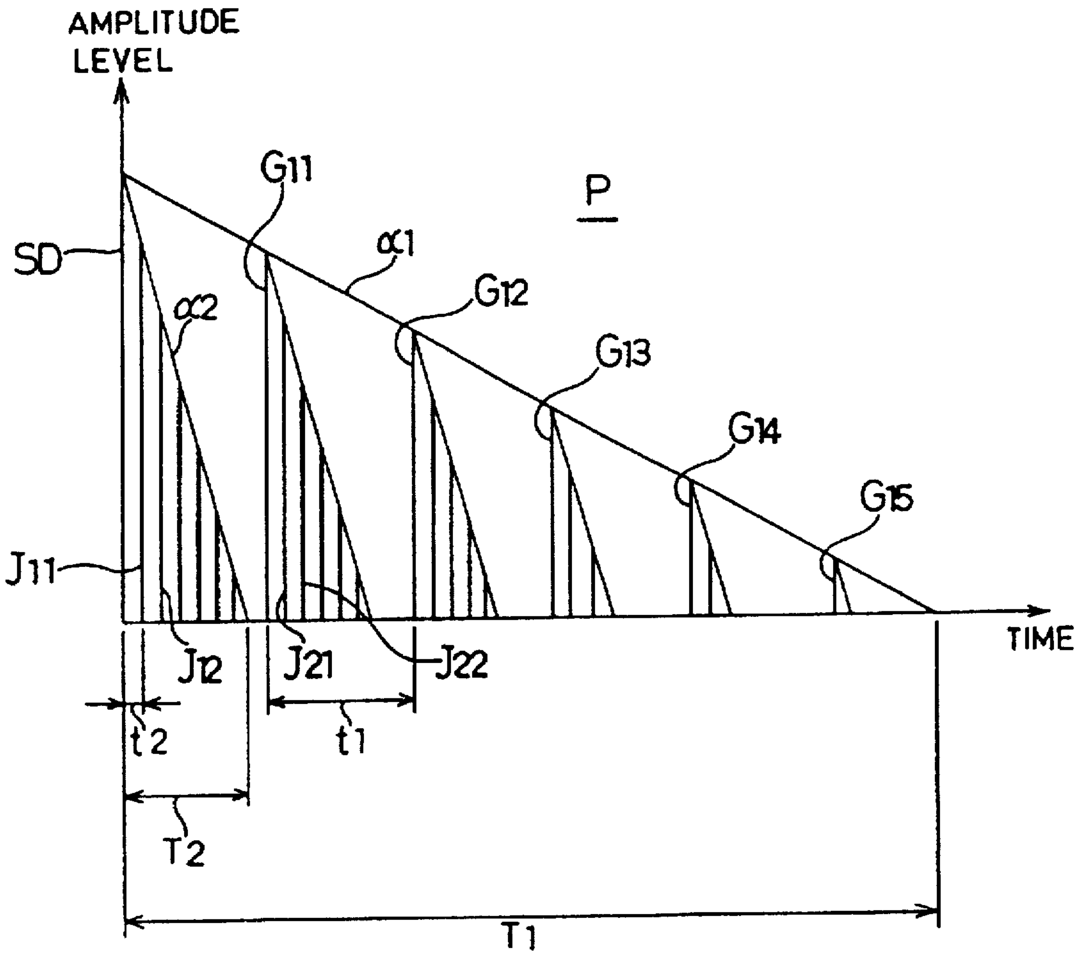
FIG. 4 illustrates subsequent reverberation sound.

FIG. 3 is a diagram illustrating early reflection sound and FIG. 4 is a diagram illustrating subsequent reverberation sound. In this embodiment, the two early reflection sound data R (R1, R2) are produced (generated) from the sound data SD of direct sound (original sound). From the sound data SD of original sound are further produced subsequent reverberation sound P that gradually attenuates. The subsequent reverberation sound P is formed (generated) by two kinds of data G (G11, G12, G13, - - - ) and J (J11, J12, J13, - - - , J21, J22, J23, - - - , J31, J32, - - - ).

Though the sound data SD of original sound, early reflection sound data R (R1, R2) and subsequent reverberation sound data G, J are represented by vertical straight lines in the drawings, they, in practice, have tone waveforms of a plurality of periods and further have envelope waveforms of attack, decay, sustain and release. Moreover, though attenuation characteristics $\alpha1$ of the subsequent reverberation sound data G and attenuation characteristics $\alpha2$ of the subsequent reverberation sound data J are represented by straight lines in the drawing, they, in practice, vary exponentially.

The sound data SD of original sound are received by the digital signal processor 11a through the A-D converter 14 and are readily output through the D-A converter 15. The sound data SD of original sound may be directly passed through without passing through the A-D converter 14 and the D-A converter 15.

The early reflection sounds R1 and R2 have different delay times D1, D2 and different amplitude levels. The subsequent reverberation sound data G (G11, G12, G13, - - - ) of the subsequent reverberation sound P are produced (generated) depending upon a delay time t1 and attenuation characteristics $\alpha1$. The subsequent reverberation sound data G has a small delay speed data SP1 and, hence, the delay speed is slow. The subsequent reverberation sound data G have a large coefficient Z1 of attenuation and, hence, attenuation is mild. The subsequent reverberation data J (J11, J12, - - - , J21, J22, - - - , J31, J32, - - - ) are produced depending upon a delay time t2 and attenuation characteristics $\alpha2$. Therefore, the subsequent reverberation sound data J have a large delay speed data SP2 and, hence, the delay speed is fast. The subsequent reverberation data J have a small coefficient Z2 of attenuation and, hence, attenuation is rapid.

The relationship between the coefficients SP1 and SP2 of attenuation speed is such that $SP1<SP2<1$. The whole delay time T2 of the subsequent reverberation sound data J is smaller than each delay time t1 of the subsequent reverberation sound data G. Here, however, the whole delay time T2 may be equal to each delay time t1, or the whole delay time T2 may be smaller than each delay time t1.

In this embodiment, the relationship between the delay times D1 and D2 is $D1<D2$ but may be $D1\geqq D2$. Moreover, the delay times D1 and D2 may be shorter or longer than the delay times t1, t2, T1 and T2 of the subsequent reverberation sound. Among them, it is desired that the delay times D1 and D2 are shorter than T2.

The early reflection sound and the subsequent reverberation sound have different time zones in which they are generated. For instance, the early reflection sound is the one reflected by the musical instrument itself such as soundboard of piano, and the subsequent reverberation sound is the one reflected by the walls and ceilings of a chamber such as a hall or a stage (sound field). The number of early reflection sounds is not limited to two but may be three or more or one per one original sound.

4. Group of Registers (First Embodiment)

Figure 5:
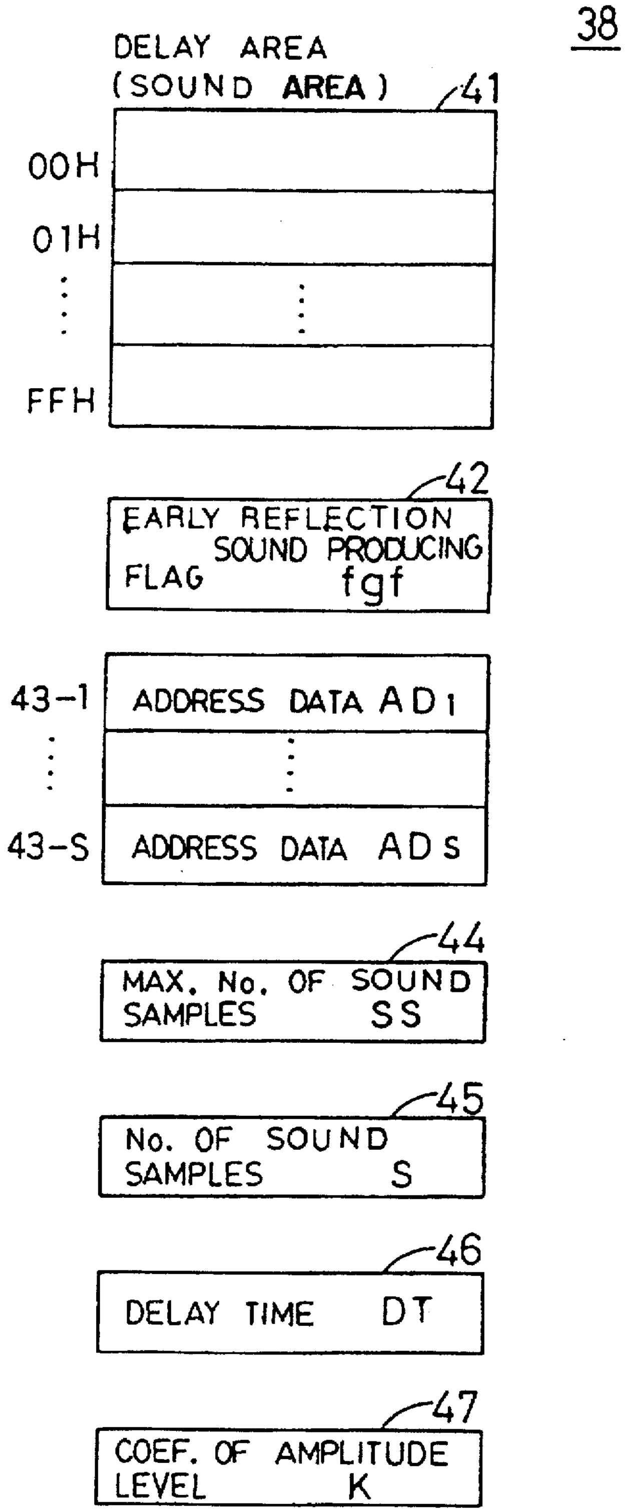
FIG. 5 illustrates a group of registers in the data RAM 38 of digital signal processors 11*a*, 11*b*.

FIG. 5 illustrates a group of registers in the data RAM 38 provided in the digital signal processor 11a. The digital signal processor 11a produces an early reflection sound R1. The group of registers may be provided in the processing RAM 12. In an early reflection sound mode register 42 is stored an early reflection sound producing flag fgf which indicates whether the processing for producing the early reflection sound should be executed or not.

A delay area 41 stores sample data of sound data SD of original sound used for producing the early reflection sound.

The sample data of the sound data SD are subjected to the delay processing and to the amplitude level processing to form sample data of a first early reflection sound data R1. Address registers 43-1 to 43-S store address data AD1 to ADS of the delay area 41. The delay area 41 can be replaced by any other semiconductor memory or CCD memory.

A maximum number of sound samples register 44 stores the data SS related to a maximum number of sound samples. The data SS related to a maximum number of sound samples represents a maximum number of samples of the sound data SD. A sound sample number register 45 stores the data s related to the number of sound samples. The data s related to the number of sound samples represent any one of the samples of the sound data SD. A delay time counter 46 stores the data DT related to delay time count. The delay time count data DT determines a delay time D1 for the first early reflection sound R1. An amplitude level coefficient register 47 stores the data K related to the coefficient of amplitude level. A coefficient K1 for determining the amplitude level of the first early reflection sound R1 is set to the amplitude level coefficient K.

A group of registers same as the above-mentioned group of registers are provided to produce a second early reflection sound R2. The group of registers for producing the second early reflection sound R2 may be provided in the data RAM 38 in the digital signal processor **11*b* for producing the second early reflection sound R2 or may be provided in the processing RAM 12**. A delay time D2 for the second early reflection sound R2 is set to the delay time count data DT. Furthermore, a coefficient K2 for determining the amplitude level of the second early reflection sound R2 is set to the amplitude level coefficient K.

Figure 6:
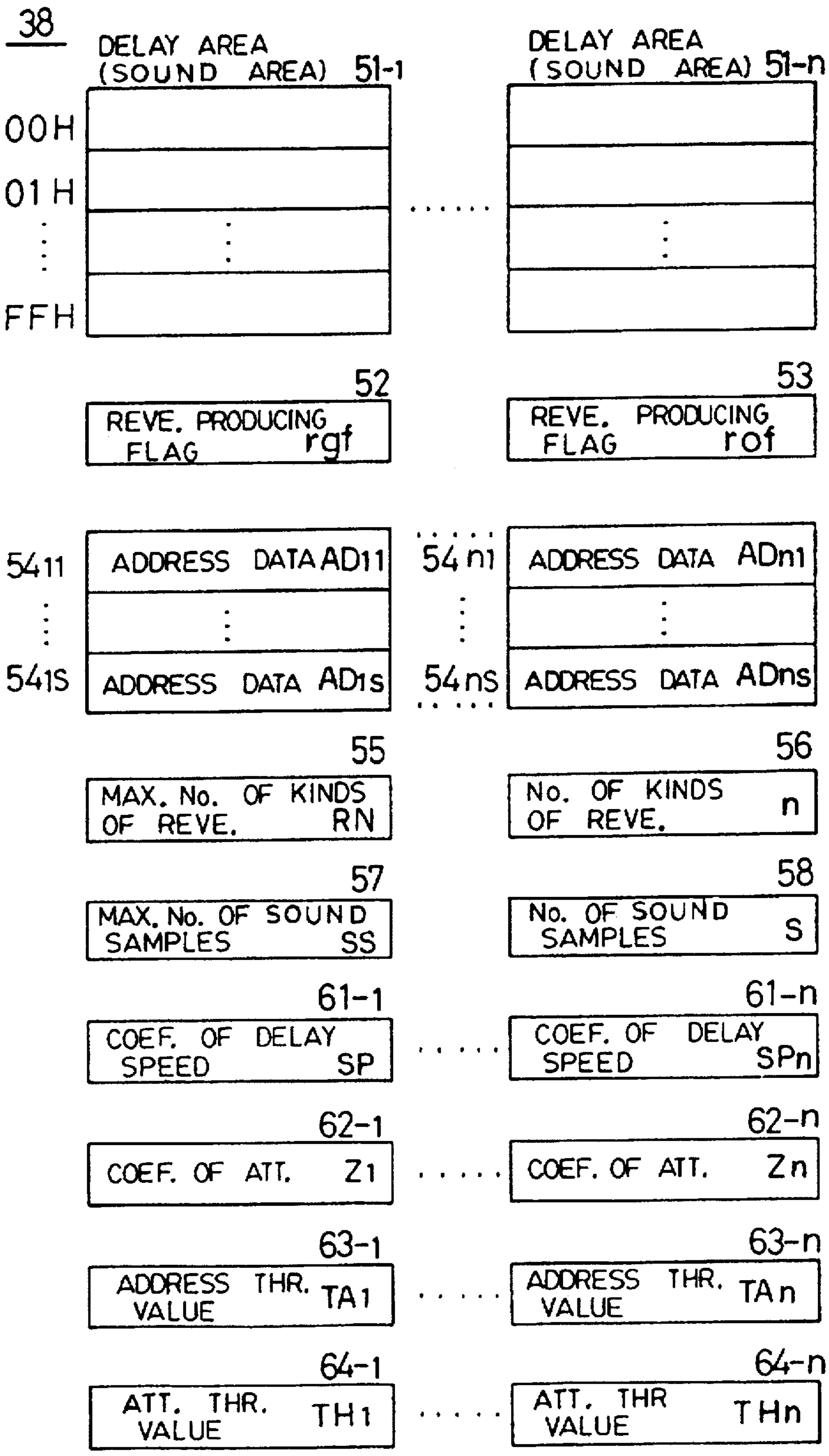
FIG. 6 illustrates a group of registers in the data RAM 38 of a digital signal processor 11*c*.

FIG. 6 illustrates a group of registers in the data RAM 38 provided in the digital signal processor **11*c* which produces a subsequent reverberation sound P. The group of registers may be provided in the processing RAM 12. A reverberation mode register 52 stores a reverberation-producing flag rgf which represents a mode of whether the processing should be executed for producing the subsequent reverberation sound or not. A reverberation output register 53** stores a reverberation output flag rof which indicates whether a first reverberation sound Jll is output or not.

Delay areas 51-1 to 51-n store sample data of sound data SD or reverberation sound data G, J of the original sound. The sound data SD of the original sound is used for producing the reverberation sound. The sample data of sound data SD or reverberation sound data G, J are subjected to the delay processing or the attenuation processing in the delay areas 51-1 to 51-n, and they are formed (generated) into sample data of reverberation sound data G, J. The number n of the delay areas 51-1 to 51-n is determined depending upon the kind of reverberation sound. In this embodiment, the number n is 2. Address registers 5411 to 541s, - - - , 54n1 to 54ns store the address data AD11 to AD1s, - - - , ADn1 to ADns of the delay areas 51-1 to 51-n. The delay areas 51-1 to 51-n may be replaced by other semiconductor memories or CCD memories.

A maximum number of kinds of reverberation register 55 stores the data RN related to a maximum number of kinds of reverberation. The data RN represents the maximum number of kinds of reverberation sounds. The kind of reverberation sound corresponds to the kind of attenuation characteristics a shown in FIG. 4. A number of kinds of reverberation register 56 stores the data n related to the number of kinds of reverberation. The data n related to the number of kinds of reverberation indicates any one of the reverberation sounds depending upon the kind of attenuation characteristics α. In this embodiment, the subsequent reverberation sound is in two kinds and the data n related to the number of kinds of reverberation is "2". The subsequent reverberation sound may be in three or more kinds.

A maximum number of acoustic samples register 57 stores the data SS related to a maximum number of acoustic samples. The data SS related to a maximum number of sound samples represent a maximum number of samples of the sound data SD subjected to the reverberation processing. A number of sound samples register 58 stores the data s related to the number of sound samples. The data s indicate any one of the samples of the sound data SD to be subjected to the reverberation processing.

The sampling period of the sound data SD is equal to the period of the processing for producing the subsequent reverberation sound. The sampling period of the sound data SD may not be equal to the period of the processing for producing the subsequent reverberation sound. It is desired that the data SS related to a maximum number of sound samples is smaller than a value obtained by dividing a minimum delay time t2 of the reverberation sounds G, J by the period of the processing for producing reverberation sound. Therefore, the time in which reverberation sound is being generated becomes shorter than the minimum delay time t2. The data SS related to a maximum number of sound samples may be larger than the value that is obtained by the above division. The number of addresses of the delay areas 51-1 to 51-n is from several to several tens of times as great as the value of the data SS related to a maximum number of sound samples. The number of addresses may be equal to the data SS related to a maximum number of sound samples.

Delay speed registers 61-1 to 61-n store delay speed coefficients SP1 to SPn. The delay speed coefficients SP1 to SPn represent speeds for delaying the reverberation sounds G, J. Furthermore, the delay speed coefficients SP1 to SPn determine the lengths of delay times t1, T1, t2 and T2 of reverberation sounds G, J. The density of reverberation is thus determined. Attenuation coefficient registers 62-1 to 62-n store attenuation coefficients Z1 to Zn. The attenuation coefficients Z1 to Zn represent the rate of attenuation of reverberation sounds G, J. The attenuation coefficients Z1 to Zn determine the attenuation characteristics α1, α2 of reverberation sounds G, J. Thus, the length of reverberation is determined.

Address threshold value registers 63-1 to 63-n store address threshold values TA1 to TAn which represent threshold values of addresses where sound data SD and reverberation sound data G, J are transferred. The address threshold values TA1 to TAn are a little smaller than the target address values TL1 to TLn.

Attenuation threshold value registers 64-1 to 64-n store attenuation threshold values. TH1 to THn which represent threshold values of attenuation levels of the acoustic data SD and reverberation sound data G, J. When the levels of reverberation sound data G, J are smaller than the attenuation threshold values TH1 to THn, the processing for producing the reverberation sound is not executed any more.

The above-mentioned early reflection sound-producing flag fgf, reverberation-producing flag rgf, data RN related to a maximum number of kinds of reverberation, data SS related to a maximum number of acoustic samples, delay speed coefficients SP1 to SPn, attenuation coefficients Z1 to Zn, address threshold values TA, TA1 to TAn, and attenuation threshold values TH1 to THn, are converted from the musical factor data, for example, in the automatic play data that have been stored in advance in a fixed manner in an electronic acoustic device. Here, the automatic play data may be set and input by the operator using the group of panel switches 3 or the keyboard 1, or may be the data that are rewritten and input, or may be the automatic play data that are played back. The automatic play data may be set and input from other device through a MIDI terminal, or may be the data that are rewritten and input.

The musical factor data include tone pitch, tone pitch range, kind of timbre, content of harmonic components, quantity of touch, kind and/or loudness of effect (reverberation, echo, glide, portamento, etc.), position of sound image, kind of rhythm, part of play (melody, chord, base, background, rhythm), amount of modulation, envelope level, envelope speed, envelope phase, lapse of sounding time, volume, number of sound generations, quantizing quantity, tempo, filter characteristics data, etc. Therefore, the delay times D1, D2 of the early reflection sounds R1 and R2, coefficients K1, K2 of amplitude level, and delay times t, T or attenuation characteristics α of the subsequent reverberation sounds G, J, change depending upon the musical factors.

Moreover, the musical factor data include the lapse of time from the start of sounding. In this case, a channel is assigned to the sound data SD. The time count data corresponding to the above channel in the time-division time counter is cleared when the sounding is started. Moreover, the time of the channel is counted in a time-divisional manner. The time counter is constituted by a ring shift register, an adder, and a group of AND gates.

The ring shift register has a plurality of areas corresponding to the number of channels and stores lapse of sounding times of the areas. The data in the areas are successively shifted for each of the channel timings and are successively output. To the data that is output is added 1 through the adder. The data passes through the group of AND gates and is input again to the ring shift register. A key-on event signal at the time of starting the sounding is inverted, is caused to pass through a latch and is fed to the above-mentioned group of AND gates. The time count data is then cleared. The lapse of sounding time consists of lapse of time of a musical tone SD, R1, R2, J, G and delay times D1, D2, T1, T2, tl, t2 of FIGS. 3 and 4.

5. Processing for Receiving the Original Sound (First Embodiment)

Figure 7:
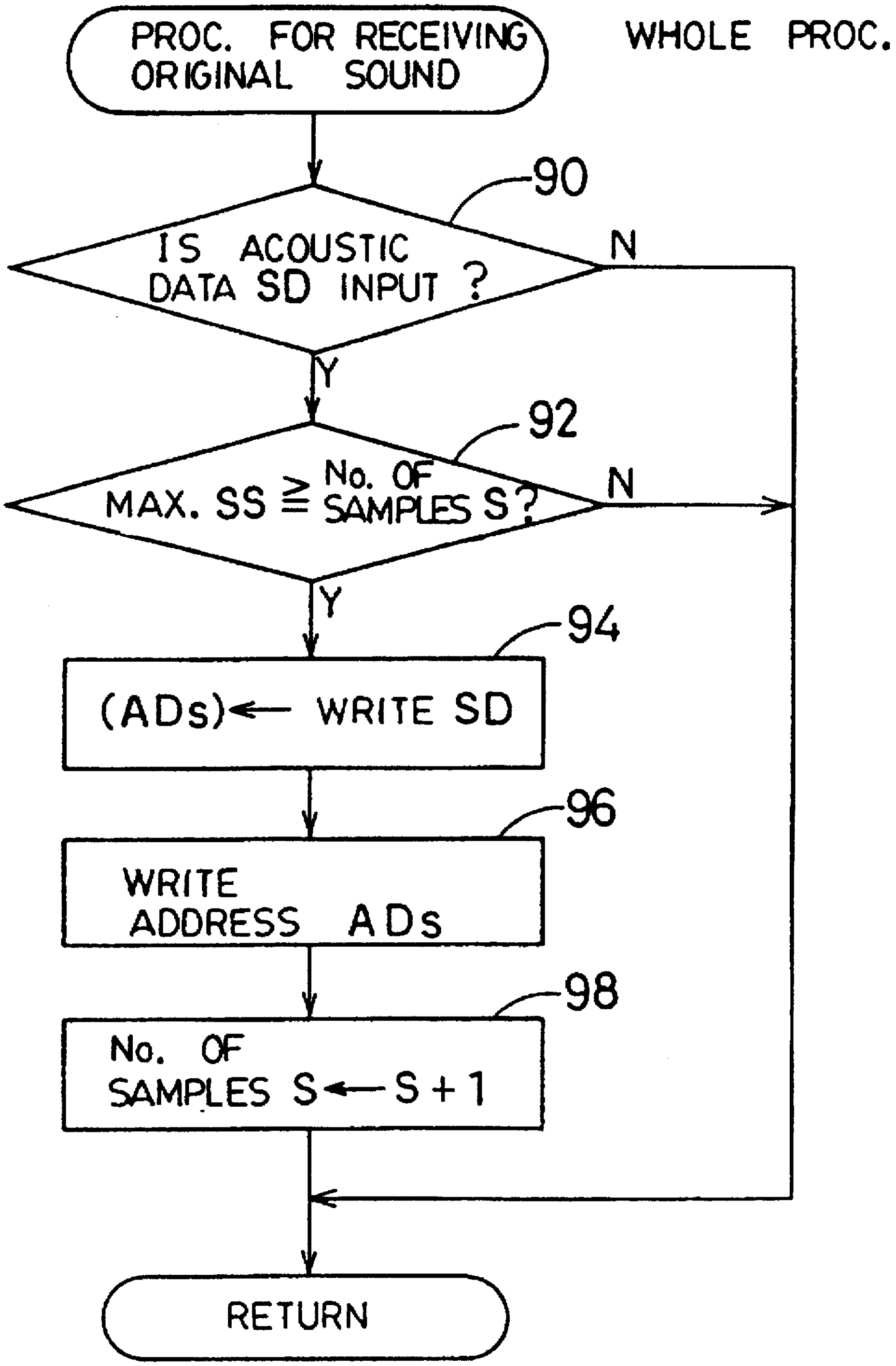
FIG. 7 is a flow chart of a processing for receiving original sound by the digital signal processors 11*a*, 11*b*.
Figure 8:
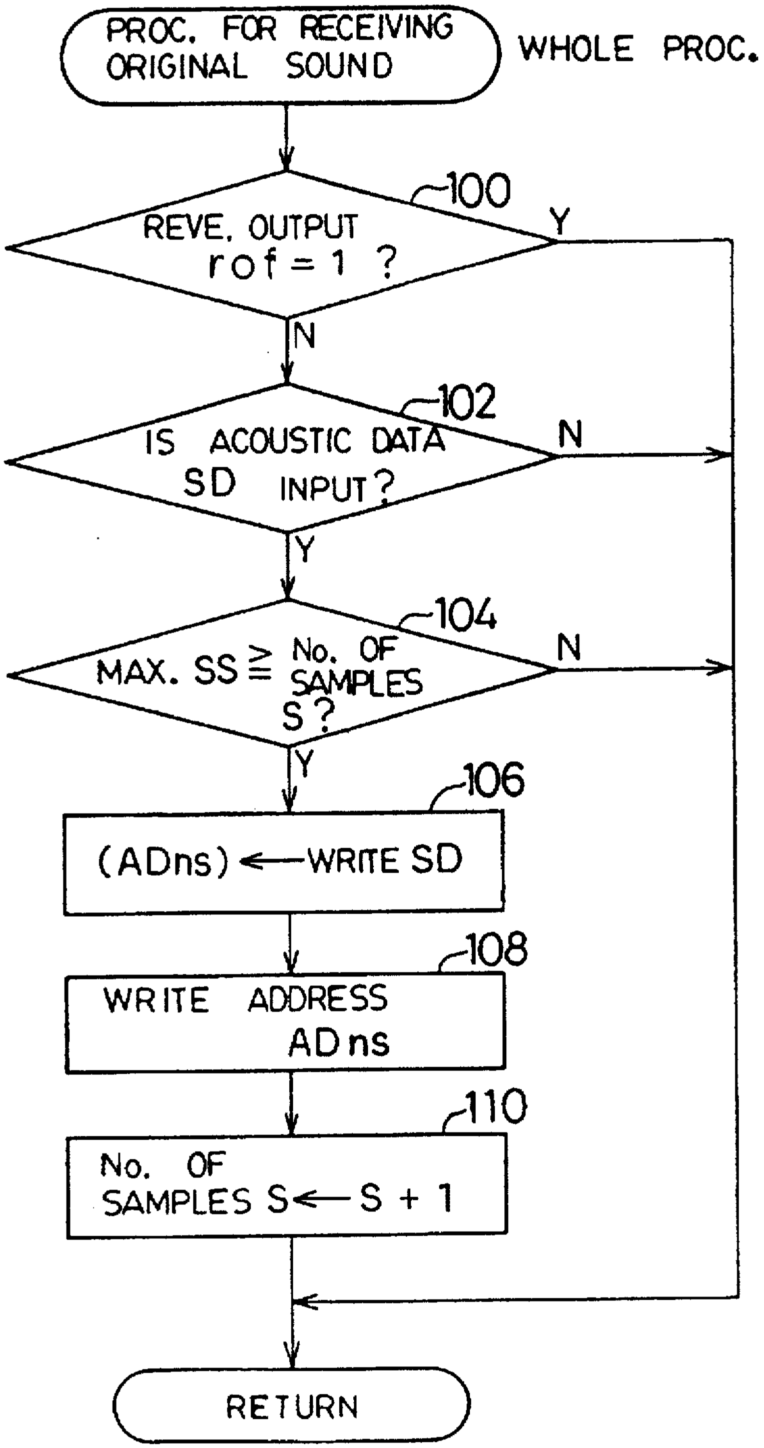
FIG. 8 is a flow chart of a processing for receiving original sound by the digital signal processor 11*c*.

FIG. 7 is a flow chart of a processing for receiving sound data SD of the original sound executed by the digital signal processors 11*a* and 11*b*. FIG. 8 is a flow chart of a processing for receiving sound data SD of the original sound executed by the digital signal processor 11*c*.

In this embodiment, the arithmetic operation from the present values of address data ADs, ADns toward the desired values is realistically (directly) carried out, and the shifting (transfer) to the rewriting of sound data SD (early reflection sounds R1, R2, reverberation sound data G, J) is realistically (directly) carried out.

Analog tone signals are converted into digital sound data SD by the A-D converter 14. The system CPU 5 gives an instruction to the digital signal processors 11*a*, 11*b* and 11*c* to produce early reflection sound or subsequent reverberation sound. For instance, the data stored in the buffer in the A-D converter 14 is discriminated by the access to the system CPU 5, or an instruction signal is fed to the system CPU 5 from the buffer. In response to an instruction from the system CPU 5, the digital signal processors 11*a*, 11*b* and 11*c* start the processing of FIGS. 7 and 8.

This processing is part of the whole processing. The whole processing is started by turning the power source on or by turning a predetermined switch on, and is repeated until the power source is turned off or the predetermined switch is turned off. When the whole processing is started, the areas of the coefficient RAM 39 and the register groups 41 to 64 are all cleared, and the early reflection sound producing flag fgf and the reverberation producing flag rgf are set to "1", the reverberation output flag rof is set to "0", the data RN related to a maximum number of kinds of reverberation is set to "2", the data n related to the kinds of reverberation is set to "1", and the data s related to the number of sound samples is set to "1". Besides, the data SS related to a maximum number of sound samples, coefficients SP1 to SPn of delay speed, coefficients Z1 to Zn of attenuation, address threshold values TA, TA1 to TAn, attenuation threshold values TH1 to TEn, delay time counter data DT, and a coefficient K of amplitude level, are set to predetermined values.

First, it is discriminated whether the sound data SD of the original sound is input to the digital signal processors 11*a*, 11*b*, 11*c* or not (steps 90, 102). In the digital signal processor 11*c*, the discriminating is executed only when the reverberation sound output flag rof has not been set (step 100). The sound data SD that is input is written into the addresses ADs, ADns that correspond to the data s in the delay areas 41, 51-1 to 51-n (steps 94, 106). At the start of processing, the addresses ADs, ADns are a start address ADst. The start address ADst is a final address in the delay areas 41, 51-1 to 51-n and does not change in any case.

Memory addresses ADs, ADns (ADst) of the sound data SD are stored in the address registers 43-S, 54ns that correspond to the data s (steps 96, 108). At the start of processing, the data s is "1". Therefore, the head sample data of the sound data SD is stored at the final address of the delay areas 41, 51-1 to 51-n, and the value (initial-period value) of the final address is stored in the address registers 43-1, 5411.

Next, the data s is increased by 1 (steps 98, 110). This routine is returned back to the whole processing. The processing for receiving the sound data SD of original sound is repeated accompanying the repetition of the whole processing. When the data s related to the number of sound samples exceeds the data SS related to a maximum number of sound samples, the processing for receiving the data is finished (steps 92, 104). Due to this processing, the sample data of sound data SD of the original sound are successively received by the delay areas 41, 51-1 to 51-n.

6. Processing for Producing the Early Reflection Sound (First Embodiment)

Figure 9:
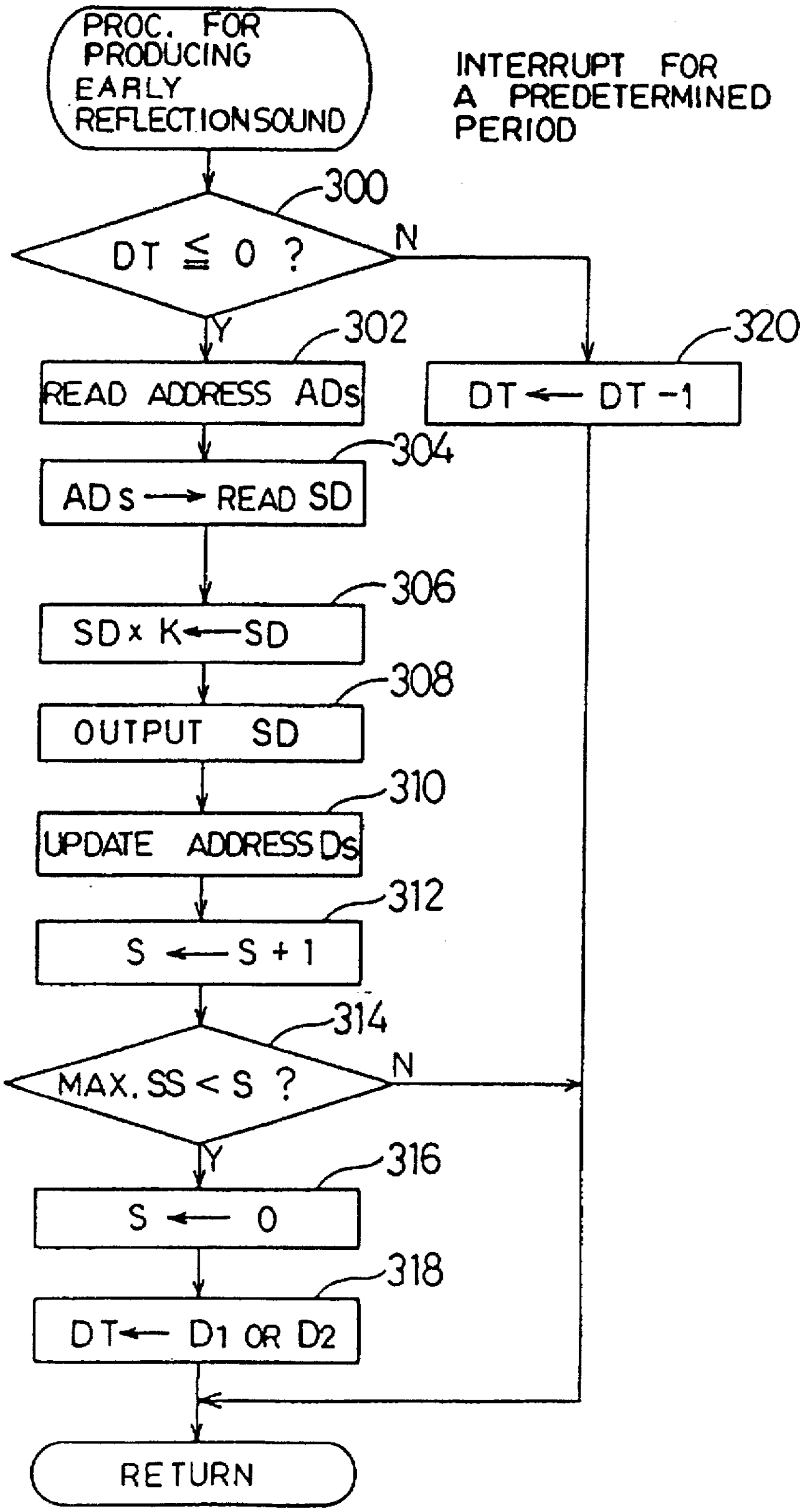
FIG. 9 is a flow chart of a processing for producing early reflection sound.

FIG. 9 is a flow chart illustrating the processing for producing the early reflection sound. At a moment when an interrupt signal INT is input to the digital signal processors 11*a* and 11*b* from an interrupt generating circuit 16, it is discriminated in the whole processing whether the early reflection sound-producing flag fgf has been set by the digital signal processors 11*a* and 11*b* or not. When this flag fgf has been set, the processing is started for producing the early reflection sound.

It is first discriminated whether the delay time count data DT is "0" or not (step 300). In initializing the whole processing, a delay time D1 of the first early reflection sound R1 is set to the delay time count data DT of the digital signal processor 11*a* and a delay time D2 of the second early reflection sound R2 is set to the delay time count data DT of the digital signal processor **11*b*. The delay time count data DT is counted down from when the sound data SD of the original sound is sampled until the delay time D1 or D2 elapses (step 320**).

As the delay time D1 or D2 elapses, address data ADs corresponding to the data s related to the number of sound samples is read out (step 302), and sound data SD of an address corresponding to the address data ADs is read out (Step 304). The sound data SD is multiplied by a coefficient of amplitude level K (K1 or K2) (step 306), and the multiplied sound data SD is sent to the D-A converter 15 (step 308).

Next, the address data ADs is updated (step 310), and the data s related to the number of sound samples is increased (step 312). The processings of steps 302 to 312 are repeated until the data s reaches the data SS (step 314). The first early reflection sound R1 and the second early reflection sound R2 are thus produced (generated). At a moment when the data s has reached the data SS related to a maximum number of sound samples, generation of the first early reflection sound R1 or the second early reflection sound R2 is finished. At this moment, the data s is reset (step 316) and the delay time count data DT is reset to D1 or D2 (step 318). The routine is returned back to the whole processing.

Thus, the two early reflection sounds R1 and R2 are produced (generated) by separate digital signal processors **11*a* and 11*b***. The first early reflection sound R1 is generated being delayed by the delay time D1 behind the original sound and has an amplitude level equal to the one obtained by multiplying the sound data SD of the original sound by the coefficient K1. The second early reflection sound R2 is generated being delayed by the delay time D2 behind the original sound and has an amplitude level equal to the one obtained by multiplying the sound data SD of the original sound by the coefficient K2. This makes it possible to execute the processing for producing the first and second early reflection sounds R1, R2 separately from the processing for producing the subsequent reverberation sound P.

7. Processing for Producing the Subsequent Reverberation Sound (First Embodiment)

Figure 10:
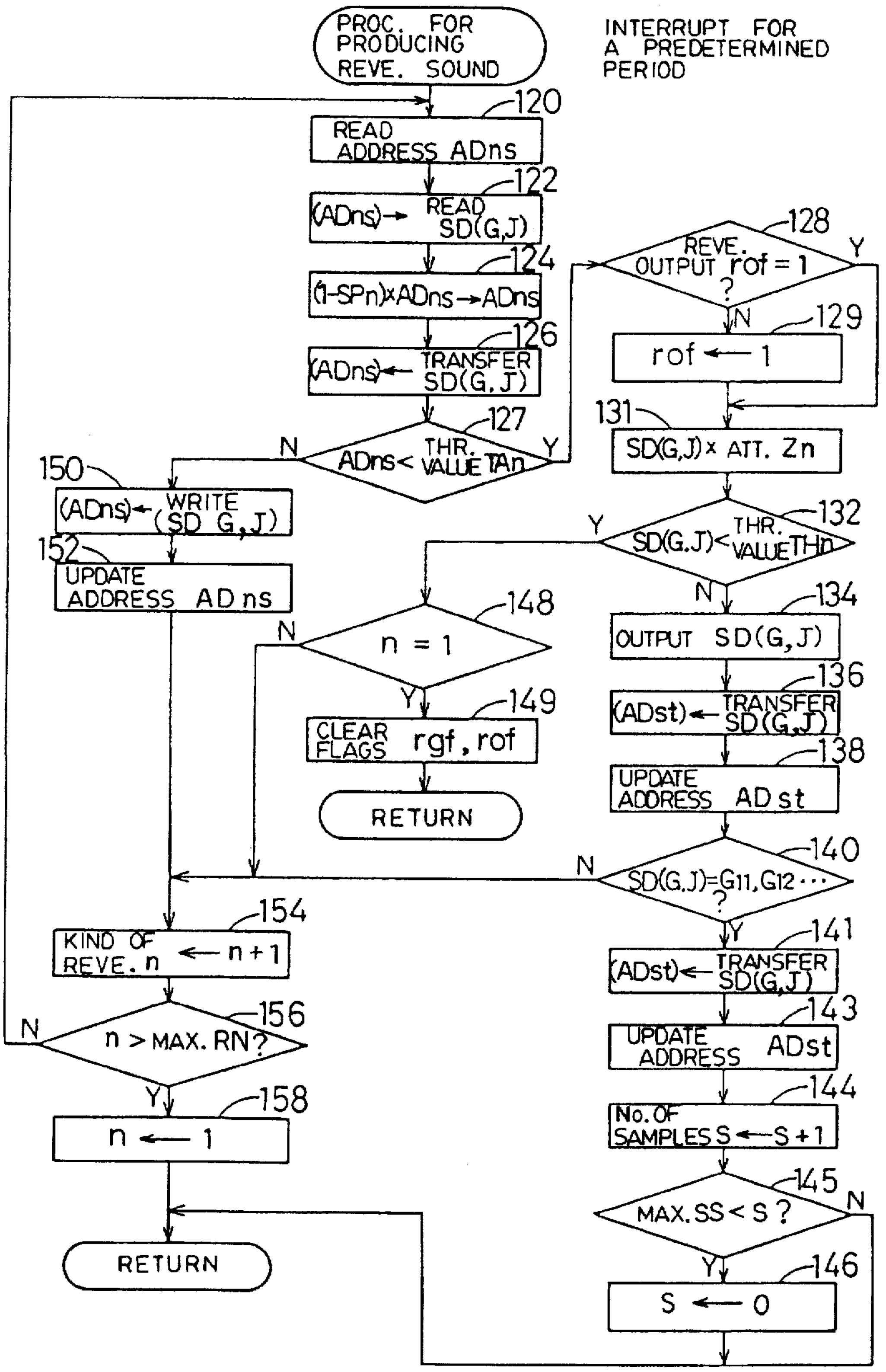
FIG. 10 is a flow chart of a processing for producing subsequent reverberation sound.

FIG. 10 is a flow chart illustrating the processing for producing the subsequent reverberation sound. In this processing, the tone data SD (reverberation sound data G, J) are transferred in the delay area 51-n at a speed depending upon the coefficient SPn of delay speed (steps 120 to 127, 150, 152). Therefore, the tone data SD (reverberation sound data G, J) are delayed by delay times t1, t2 (step 127) and are attenuated depending upon the attenuation coefficient Zn (step 131). There are output the tone data SD (reverberation sound data G, J) that have been subjected to the delay processing and to the attenuation processing (step 134).

As described above, the tone data SD (reverberation sound data G, J) subjected to the delay processing, attenuation processing and output processing, are transferred again to the head of the delay area 51-n (steps 136, 138) and are subjected to the next delay processing, attenuation processing and output processing. The processings for outputting the reverberation sound (steps 120 to 127, 150, 152, 154, 156, 127, 131, 134, 136, 138) are repeated for each of the reverberation sounds G, J of each kind (steps 154 and 156). The processings for outputting the reverberation sound are further repeated for each sample data of the reverberation sound data G, J (steps 144 to 146).

At a moment when an constant cyclic interrupt signal INT is input to the digital signal processor **11*c* from the interrupt generating circuit 16, it is discriminated in the whole processing whether the reverberation producing flag rgf has been set by the digital signal processor 11*c*** or not. When the reverberation producing flag rgf has been set, the processing is started for producing the reverberation sound.

First, the address data ADns stored in the address register 54ns corresponding to the data s are read out (step 120). Then, the sound data SD or the reverberation sound data G of an address corresponding to the address data ADns in the delay area 51-n are read out (step 122). A new address value to which the sound data SD or the reverberation sound data G are transferred is found in compliance with the following expression (step 124), $$(TLn-ADns)\times SPn+ADns\rightarrow ADns \quad (1)$$

where TLn is a target address value, SPn is a coefficient of delay speed, and ADns is a present address value.

The sound data SD or the reverberation sound data G are transferred to the delay area 51-n which corresponds to the new address value found in compliance with the expression (1) (step 126).

The start address ADst is the final address of the delay area 51-n, and the target address TLn is OOH where H is a symbol representing a hexadecimal number. Therefore, the expression (1) can be rewritten as follows:

$$(1-SPn)\times ADns\rightarrow ADns \quad (2)$$

It is discriminated whether the new address value ADns is smaller than the address threshold value TAn or not (step 127). This is to avoid the occurrence of such an error that a change due to the operation decreases and saturates into "0" preventing the operated value from arriving at the target address values TL1 to TLn no matter how much the operation is carried out. Due to the nature of the digital data, the new address value repetitively found in compliance with the expression (2) never comes into agreement with OOH which is the desired address value. As described above, therefore, the new address value is compared with an address threshold value TAn which is ahead of the desired address value OOH. When the expression (2) is repeated m times, for instance, the new address value is given by the following expression, $$(1-SPn)m\ ADns\rightarrow ADns \quad (3)$$

Since ADns≠0, the value operated according to the expression (3) becomes "0" only when SPn=1. When SPn=1, however, the target address value TLn is readily reached through one time of operation. Therefore, the above-mentioned address threshold value TAn is used.

In the step 127, furthermore, the discrimination may be executed as described below. For instance, the new address value found according to the expression (2) is compared with the old address value of before being operated. When there is no change in the value, it is so judged that the new address value has reached the target address value. That is, when a change in the value operated according to the expression (2) is saturated, it is so judged that the address ADns has reached the target address.

In this embodiment, the relationship between the delay speed coefficients SP1 and SP2 depending upon the attenuation characteristics α1 and α2 is such that SP1 <SP2<1. Referring to FIG. 4, furthermore, the relationship between the whole delay time T2 of attenuation characteristics α2 and the delay times t1 of reverberation sounds Glm, Gl(m+1) of attenuation characteristics α1 is such that T2≦t1. Here, it is also allowable that the whole delay time T2>delay times t1.

When the new address value ADns is greater than the address threshold value TAn at the step 127, the sound data SD or the reverberation sound data G are transferred to an address corresponding to the new address ADns in the delay area 51-n (step 150). Thus, the sound data SD or the reverberation sound data G stored in the start address ADst are transferred to the new address.

Then, the address data ADns corresponding to the data s related to the number of sound samples in the address register 54ns is updated to the new address value ADns (step 152). Thereafter, the value of the data n related to the number of kinds of reverberation is increased by 1 (step 154). The processings for producing reverberation sound of the steps 120 to 152 are repetitively executed even for other sound data SD or reverberation sound data J (step 156). The data n related to the number of kinds of reverberation is reset to "1" (step 158) and the routine is returned back to the whole processing.

When the new address value ADns has reached the address threshold value TAn at the step 127, it is discriminated whether the reverberation output flag rof has been set or not (step 128). The reverberation output flag rof that has not been set, is then set (step 129). The sound data SD or the reverberation sound data G, J read out from the delay areas 51-1 to 51-n at the step 122 are multiplied by the attenuation coefficient Zn, thereby to find the level data of reverberation sounds G, J shown in FIG. 4 (step 131). The level of the sound data SD or the reverberation sound data G, J after the operation that is greater than the attenuation threshold value THn (step 132), is output to the D-A converter 15 (step 134). Thus, the attenuated reverberation sound is output.

The delay time t1 of reverberation sound G is longer than the delay time t2 of reverberation sound J. Therefore, reverberation sounds J11, J12, J13, - - - are, first, output, reverberation sound G11 is, then, output, followed by the output of reverberation sounds J21, J22, J23, - - - as well as reverberation-sounds G12, J31, J32, J33, - - - , G13, J41, J42, J43, - - - . Thereafter, the reverberation sound data G, J that are output, are transferred again to the start address ADst of the delay areas 41-1 to 41-n (step 136). The address data ADns corresponding to the data s related to the number of sound samples in the address register 54ns is updated to the new start address value ADst (initial value)(step 138). Then, the processing is made ready for the next reverberation sounds G, J.

When the data n related to the number of kinds of reverberation is "1", sample data at the heads of reverberation sounds G11, G12, G13, - - - (FIG. 4) are output (step 140). Then, the reverberation sound data G, J that are output, are transferred not only to the delay area 51-1 that corresponds to the data n but also to the start address ADst in other delay areas 51-n (step 141). The address data ADns corresponding to the data s in the address register 54ns is updated to the new start address value ADst (initial value) (step 143). Then, the processing is made ready for the reverberation sounds J21, J31, J41, - - - of the reverberation sounds G11, G12, G13, - - - . The data s related to the number of sound samples is then increased by 1 (step 144). The data s related to the number of sound samples is reset to "1" when its value exceeds the data SS related to a maximum number of sound samples (steps 145, 146).

When the reverberation sounds J11, J12, J13, - - - , J21, J22, J23, - - - , J31, J32, J33, - - - are output, the discrimination at the step 140 is NO and a value of the next data n is increased by 1 (step 154). The processings for producing reverberation sound of the steps 120 to 152 are repetitively executed for other sound data SD or the reverberation sound data J (step 156).

When the sound data SD or the reverberation sound data G, J after the operation are smaller than the attenuation threshold value THn at the step 132, it is then discriminated whether the data n is "1" or not (step 148). When n=1, the reverberation producing flag rgf and the reverberation output flag rof are cleared (step 149), and the routine is returned back to the whole processing. Then, the processing for producing the subsequent reverberation sound is finished. Here, the reverberation producing flag rgf that has not been set may be set after the step 100 of processing for receiving the original sound.

When the reverberation sound G having attenuation characteristics $\alpha 1$ is to be produced (generated), it is discriminated at the step 132 whether the data of reverberation sound G have decreased down to such a level that there is no need of producing reverberation sound any more. When the discriminated result is YES, the reverberation sound J having attenuation characteristics $\alpha 2$ produced (generated) by the reverberation sound G having attenuation characteristics $\alpha 1$, have been already decreased down to such a level that there is no need of producing reverberation sound any more, as a matter of course.

As described above, this embodiment makes it possible to generate two kinds of subsequent reverberation sounds G, J. Moreover, attenuation speed coefficients SPn are changed to change the delay times T1, T2 of reverberation sounds. This is because, according to the aforementioned expression (2), the address value ADns to which the data are transferred arrives at the target address OOH after a small value m as the attenuation speed coefficient SPn approaches "1". Moreover, the attenuation coefficient Zn is changed to change the length of reverberation sound. Furthermore, the coefficients SPn, Zn may be arbitrarily set by the player using a bender, a volume and the like in the group of panel switches 3. Thus, the subsequent reverberation sound of tone generated by the electronic instrument can be arbitrarily changed by the player.

According to this embodiment, furthermore, the two early reflection sounds R1, R2 and the subsequent reverberation sound P are produced (generated) by using separate digital signal processors 11*a*, 11*b* and 11*c*. Accordingly, the device of this embodiment is capable of processing the early reflection sounds R1, R2 and the subsequent reverberation sound P in different modes. Moreover, the device of this embodiment is capable of processing the early reflection sounds and the subsequent reverberation sound without any limitation in time, and is capable of executing many processings which are overlapped in time.

The subsequent reverberation sound P is produced (generated) as the direct sound (original sound) and is repetitively reflected by the walls in the room. With the delay times T1, T2, t1, t2 and the attenuation characteristics $\alpha 1$, $\alpha 2$ being determined, therefore, there can be produced (generated) reverberation sounds G, J that regularly attenuate and are generated after every predetermined time interval. On the other hand, the early reflection sounds R1 and R2 are the ones produced (generated) as the direct sound (original sound) is reflected by the instrument itself or is first reflected by the walls in the room. Therefore, the early reflection sounds R1 and R2 have irregular and different amplitude levels. Moreover, the delay times D1 and D2 are irregular and different. Therefore, the amplitude levels and delay times must be determined for every early reflection sound. Besides, the early reflection sound is the one that is generated within very short periods of time after the generation of the direct sound (original sound). Accordingly, the early reflection sound must be generated at a high speed.

Moreover, the head portion of reverberation sound of the direct sound (original sound) overlaps the early reflection sounds R1, R2 in time or is generated earlier in time. In this case, it is difficult to produce both the early reflection sound and the subsequent reverberation sound using a single digital signal processor. This is because, noise is generated in this case, and the production of either the early reflection sound or the subsequent reverberation sound must be omitted, deteriorating the quality of reverberation effect.

8. Second Embodiment

Figure 11:
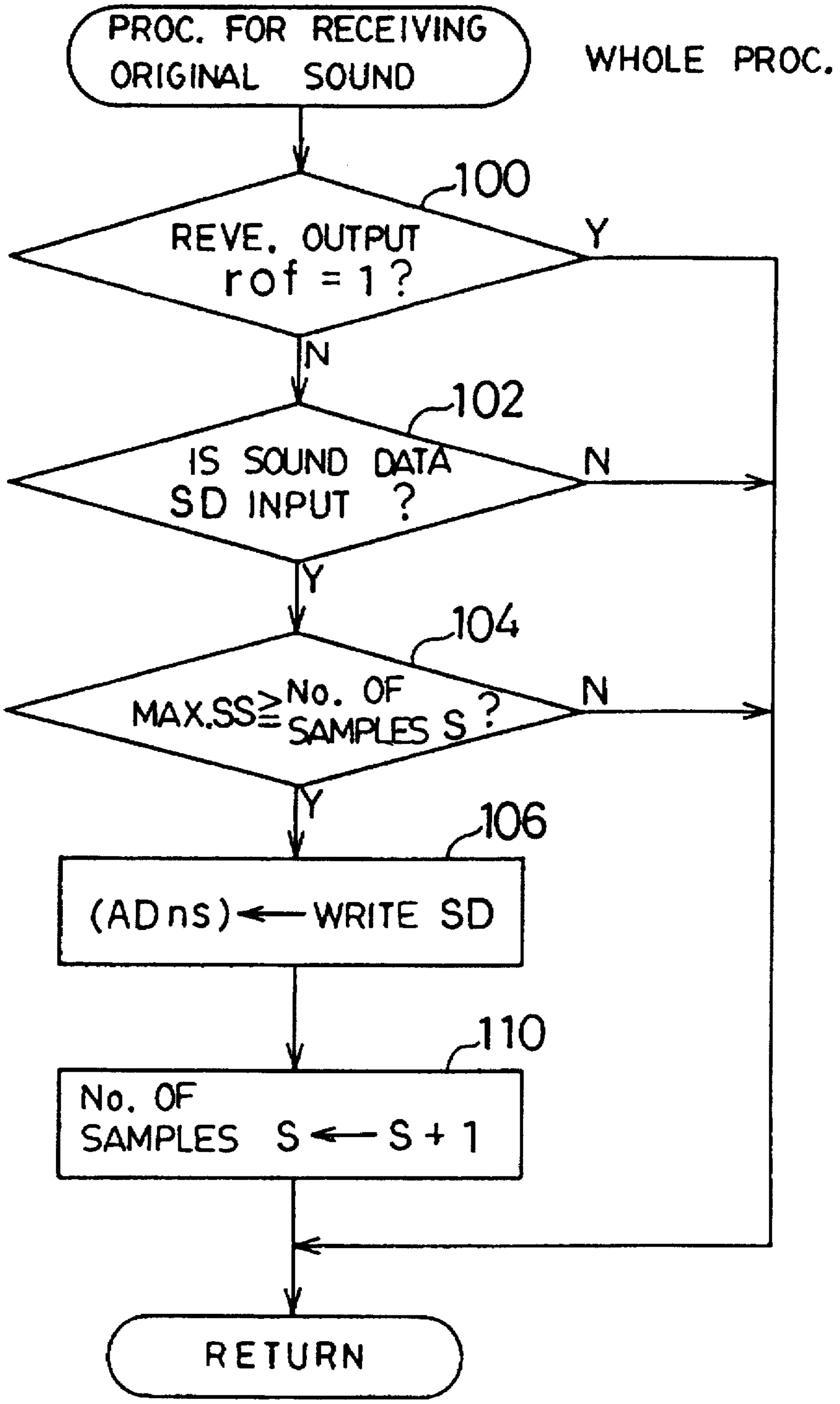
FIG. 11 is a flow chart of a processing for receiving original sound executed by a second embodiment.
Figure 12:
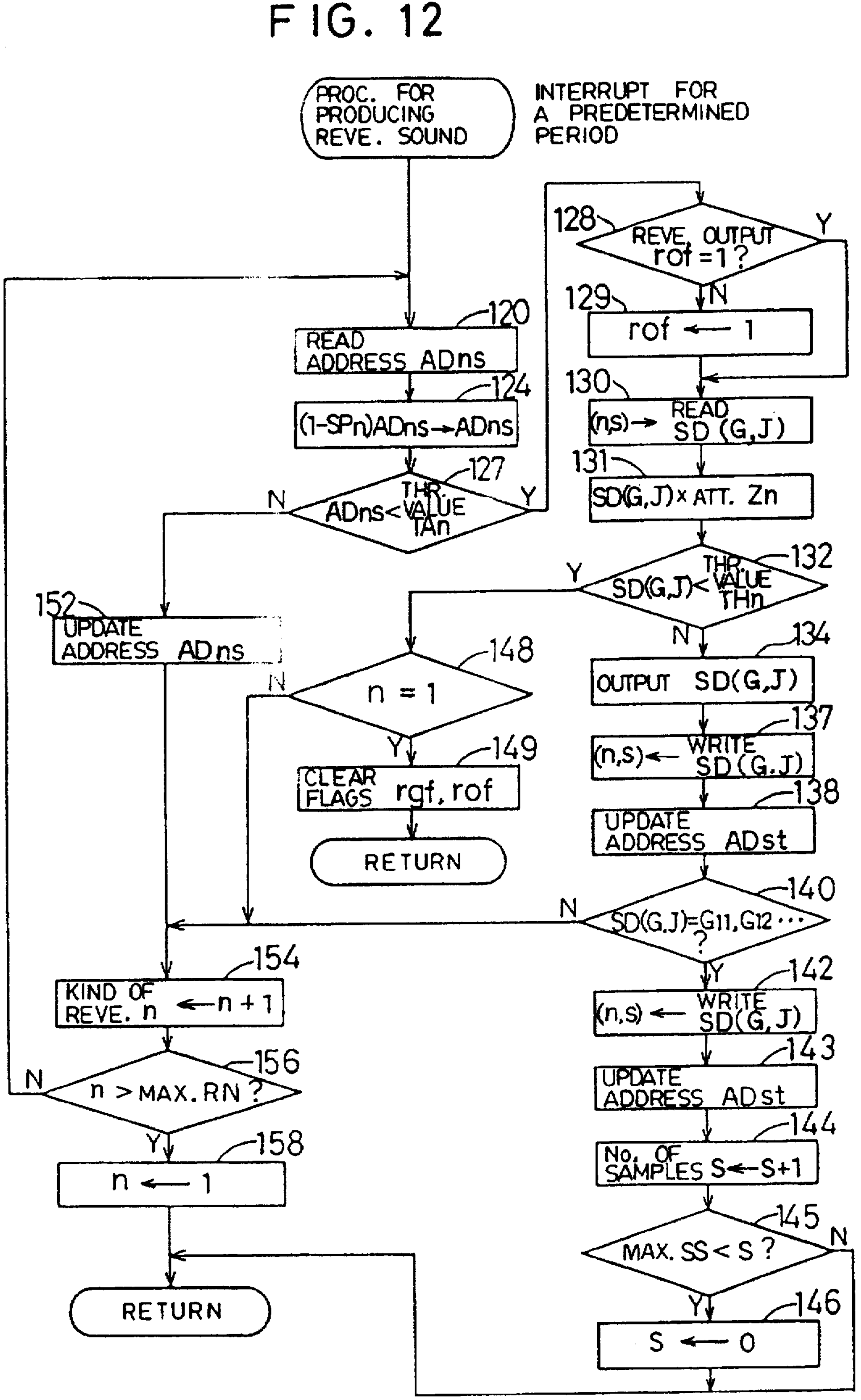
FIG. 12 is a flow chart of a processing for producing reverberation sound executed by the second embodiment.

The processing for producing the subsequent reverberation sounds P (G, J) shown in FIG. 10 can be replaced by the processing shown in FIG. 12. Furthermore, the processing for receiving the original sound shown in FIG. 8 can be replaced by the processing shown in FIG. 11. The constitution and processings in other respects of the second embodiment are the same as those of the first embodiment. In FIGS. 11 and 12, the steps for executing the same processings as those of the steps of FIGS. 8 and 10 are denoted by the same reference numerals.

9. Processing for Receiving the Original Sound (Second Embodiment)

FIG. 11 is a flow chart of the processing for receiving the sound data SD of original sound. This processing is executed by the digital signal processor 11*c* of the second embodiment. In this processing, the delay areas 51-1 to 51-n are directly used as sound areas 51-1 to 51-n. The sample data of sound data SD are stored in the sound areas 51-1 to 51-n. The sample data of sound data SD in the sound areas 51-1 to 51-n attenuate as the reverberation sound data G, J are output. In this embodiment, the sound data SD (reverberation sound data G, J) are not shifted (transferred) for being rewritten. The address data ADns only is virtually (indirectly) shifted (transferred) for being rewritten, and is operated from the present value toward a target value.

The routine of FIG. 11 is started when the sound data SD of original sound are input via the A-D converter 14 like in the first embodiment. It is discriminated whether the sound data SD of original sound are input or not (step 102). This processing is executed on condition that the reverberation output flag rof has not been set yet (step 100). When the data s related to the number of sound samples is not larger than the data SS related to a maximum number of sound samples (step 104), the sound data SD are written into the addresses ADns in the sound areas 51-1 to 51-n (step 106). The addresses ADns correspond to the data s related to the number of sound samples.

Then, the data s is increased by 1 (step 110), and the routine is returned back to the whole processing. The processing for receiving the sound data SD of original sound is repeated. The processing for receiving the original sound terminates when the data SS is exceeded by the data s (step 104). Accordingly, the sample data of sound data SD of original sound are successively received by the sound areas 51-1 to 51-n.

10. Processing for Producing Reverberation Sounds (Second Embodiment)

FIG. 12 is a flow chart of the processing for producing reverberation sounds according to the second embodiment. This processing operates the delay, so that the address data ADns is attenuated toward the target address at a speed corresponding to the delay speed coefficient SPn (steps 120 to 127, 152).

After the delay times t1, t2 have passed (step 127), the data SD (G, J) are read out (step 130). Then, the data SD (G, J) attenuate depending upon the attenuation coefficient Zn (step 131) and are output (step 134). The attenuated reverberation sounds G, J are stored (step 137), and a preparation is made to subject the attenuated reverberation sounds G, J to the delay operation processing again (step 138).

The reverberation sound output processings (steps 120 to 127, 130, 131, 137, 138, 152) are repeated for the reverberation sounds G, J of each kind (steps 154, 156), and are further repeated for each sample data of reverberation sound data G, J (steps 144 to 146).

When an interrupt signal INT of a predetermined period is input to the digital signal processor 11*c* from the interrupt generating circuit 16, it is discriminated in the whole processing whether the reverberation producing flag rgf has been set by the digital signal processor 11*c* or not. When the reverberation producing flag rgf has been set, the processing is started to produce reverberation sound.

First, the address data ADns stored in the address register 54ns depending upon the data s related to the number of sound samples is read out (step 120). Then, a new address value where the sound data SD or the reverberation sound data G, J will be transferred, is found in compliance with the following expression (step 124), $$(1-SPn)\times ADns \tag{2}$$

It is discriminated whether this new address value ADns is smaller than the address threshold value TAn or not (step 127). When the new address value ADns is greater than the address threshold value TAn, the address data ADns corresponding to the data s in the address register 54ns is updated into this new address ADns (step 152). Then, the value of the data n related to the number of kinds of reverberation is increased by 1 (step 154). The processings for producing reverberation sound of the steps 120 to 152 are repeated for other sound data SD or reverberation sound data J (step 156). Then, the data n is reset to "1" (step 158) and the routine is returned back to the whole processing.

Thereafter, the processings for receiving the sound data SD of original sound of the steps 100 to 110 are repeated. Then, next sample data of the sound data SD of original sound are received by the sound areas 51-1 to 51-n, successively. Thereafter, the processing for receiving the original sound and the processing for producing reverberation sound are alternatingly repeated after every predetermined period. Accordingly, the sample data of the sound data SD are successively written into the sound areas 51-1 to 51-n.

Discrimination of the step 127 is YES when the new address value ADns reaches the address threshold value TAn. Moreover, when the reverberation output flag rof has not been set, this flag rof is set (steps 128, 129). Then, the sound data SD or reverberation sound data G, J are read out from the address corresponding to the data s in the sound area 51-n (step 130). The read address is an s-th address from the head of the sound area 51-n that corresponds to the data n.

Next, the sound data SD or the reverberation sound data G, J are multiplied by the attenuation coefficient Zn, thereby to calculate the level data of reverberation sounds G, J shown in FIG. 4 (step 131). The sound data SD or reverberation sound data G, J multiplied by the attenuation coefficient Zn, that are greater than the attenuation threshold value THn (step 132), are output to the D-A converter 15 (step 134). Attenuated reverberation sounds are thus output.

Next, the attenuated reverberation sound data G, J are written into the sound areas 51-1 to 51-n (step 137). The write address is an s-th address from the head of the sound area 51-n that corresponds to the data n related to the number of kinds of reverberation. The address data ADns in the address register 54ns corresponding to the data s related to the number of sound samples is updated again to the start address value ADst at the head (step 138). The start address value SDst is an initial value. The processing is then prepared for the next reverberation sounds G, J.

When the data n is "1", the sample data at the heads of reverberation sounds G11, G12, G13, - - - (FIG. 4) are output (step 140). Then, the attenuated reverberation sound data G, J are written not only into the sound area 51-1 corresponding to the data n but also into other sound areas 51-n (step 142). The write address is an s-th address from the head of the sound area 51-n that corresponds to the data n. The address data ADns in the address register 54ns corresponding to the data s is updated again to the start address value ADst at the head (step 143). Thus, the processing is prepared for the reverberation sounds J21, J31, J41, - - - of the reverberation sounds G11, G12, G13, - - - .

Then, the data s is increased by 1 (step 144). The data s is reset to "0" when it has exceeded the data SS (steps 145, 146).

Discrimination at the step 132 is YES when the sound data SD or the reverberation sound data G, J are smaller than the attenuation threshold value THn. When the data n is "1" (step 148), the reverberation producing flag rfg and the reverberation output flag rof are cleared (step 149), and the routine is returned back to the whole processing. Thus, the processing for producing the reverberation sound is finished. The reverberation producing flag rgf may be set here if it has not been set even after the step 100 of the processing for receiving the original sound.

In the operation at the step 124, the delay speed coefficient SPn may be subtracted from the address data ADns. Then, the address threshold value TAn becomes unnecessary.

11. Third Embodiment

Figure 13:
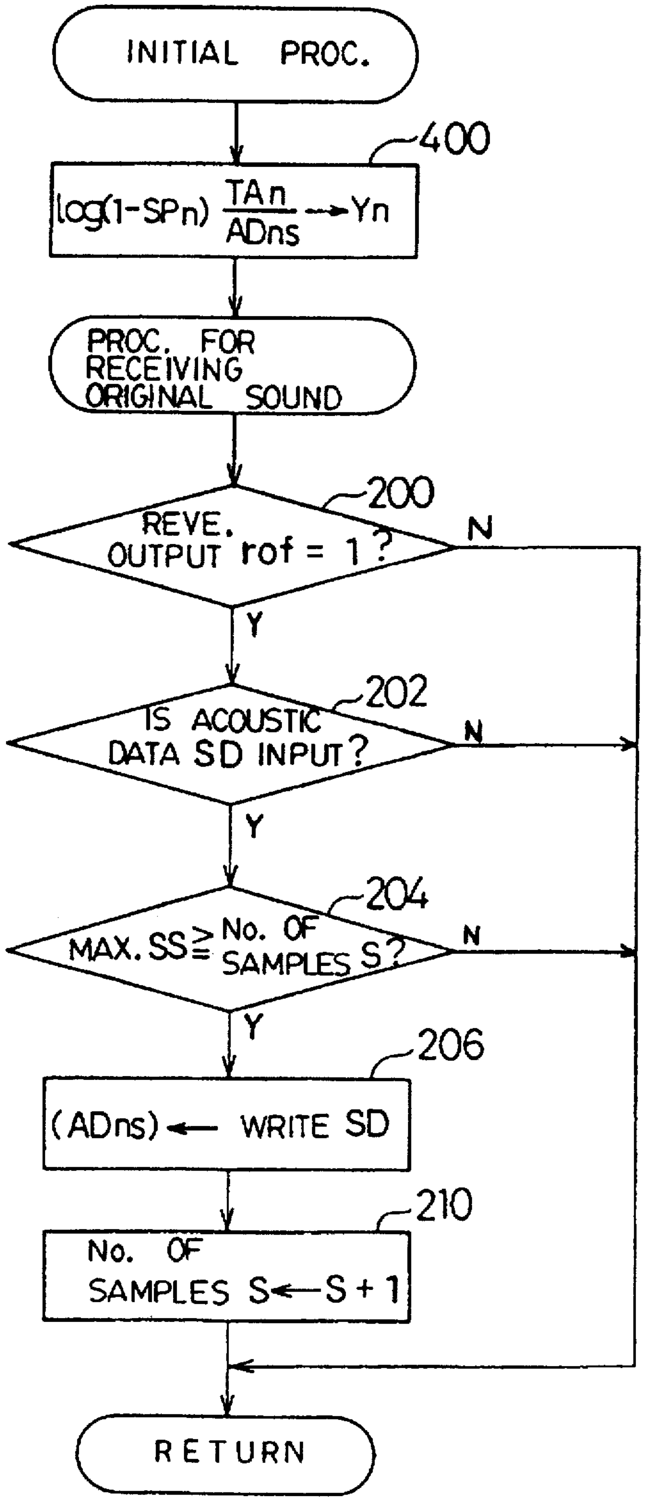
FIG. 13 is a flow chart of a processing for receiving original sound executed by a third embodiment.
Figure 14:
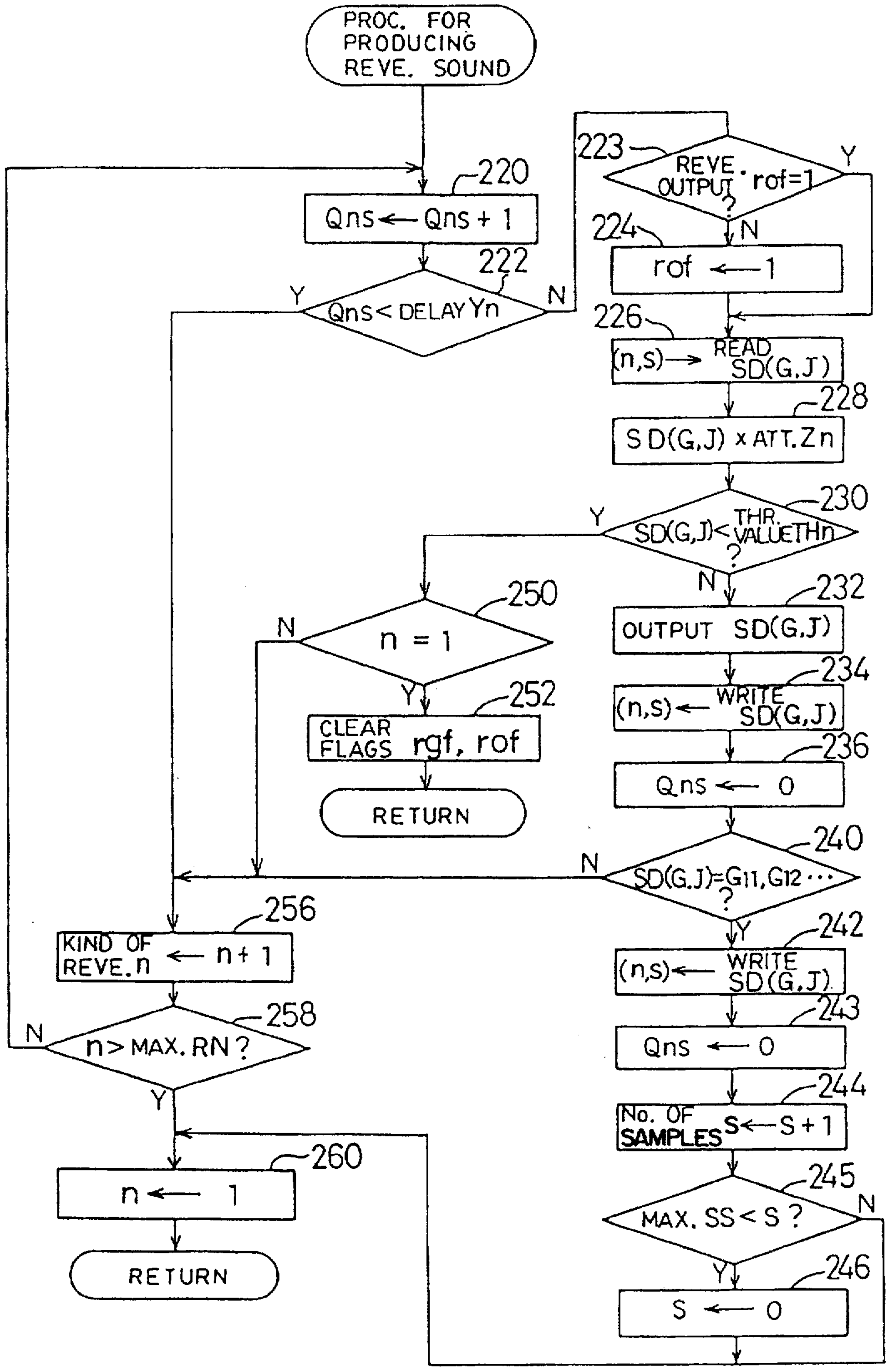
FIG. 14 is a flow chart of a processing for producing reverberation sound executed by the third embodiment.

The processing for producing the subsequent reverberation sounds P(G, J) shown in FIG. 10 can be replaced by a processing shown in FIG. 14. Moreover, the processing for receiving shown in FIG. 8 can be replaced by a processing shown in FIG. 13. In other regards, the constitution and processing of the third embodiment are the same as those of the first embodiment.

12. Processing for Receiving the Original Sound (Third Embodiment)

FIG. 13 illustrates a flow chart of the processing for receiving the sound data SD of original sound. This processing is executed by the digital signal processor 11*c* of the third embodiment.

Here, the number m is operation times of the expression (2) until the sound data SD arrives at the target address from the start address ADst, and is determined by the delay speed coefficient SPn. The number of times the sound data SD move in the delay areas 51-1 to 51-n before the sound data SD arrives at the target address is found from the aforementioned expression (3). Here, the expression (3) is deformed as given below, and m (Yn) is found by which the sound data SD becomes equal to the address threshold value TAn.

$$\log(1-SPn)(TAn)/(ADns)\rightarrow m(Yn) \quad (4)$$

When the integrated number of times the interrupt signal INT is generated exceeds the solution of the expression (4) and when the reverberation sounds are output, the processing for producing the reverberation sounds is executed in the same manner as in the first embodiment. The processing for producing the reverberation sounds is started at a moment when the interrupt signal INT is input to the digital signal processor 11*c* from the interrupt-generating circuit 16.

According to the third embodiment as described above, the number of times of operating the delay is found from the delay speed coefficient SPn, and the processing for producing the reverberation sounds is executed depending upon the number of times of operating the delay. The number of times of operating the delay corresponds to the number of times the sound data SD moves in the delay areas 51-1 to 51-n in the first embodiment.

In the third embodiment, the data RAM 38 stores the data Yn related to the number of times of operating the delay and the data Qns related to the present number of times of operating. The data Yn represents the number of times of operation that correspond to the length of the aforementioned delay times t1, t2 (- - - tn). The data Qns represents the number of times the operation is executed for accomplishing the delay. The data Yn is stored for each kind of reverberation sound. The data Qns is stored for each sample data of reverberation data SD (reverberation sound data G, J).

In the third embodiment, the operation is not so carried out that the address data ADns arrives at a target value from the present value. However, the data Yn is calculated at a step 400, and the data Qns is increased at a step 220. Thus, the operation by which the address data ADns arrives at the target value from the present value is carried out virtually or indirectly. As a result, the shift or transfer for rewriting the sound data SD (reverberation sound data G, J) is carried out virtually or indirectly.

The data Yn related to the number of times of operating the delay is calculated in the initial processing (step 400). The data Qns related to the present number of times of operating is cleared in the initial processing.

First, when the reverberation output flag rof has not yet been set (step 200), it is discriminated whether the sound data SD of original sound are input to the digital signal processor 11*c* or not (step 202). Next, when the data s related to the number of sound samples is not larger than the data SS related to a maximum number of sound samples (step 204), the sound data SD are written into the address ADns corresponding to the data s in the sound areas 51-1 to 51-n (step 206).

Next, the data s is increased by 1 (step 210), and the routine is returned back to the whole processing. The processing for receiving the sound data SD of original sound is repeated. The routine is completed when the data SS is exceeded by the data s related to the number of sound samples (step 204). Due to this processing, the sample data of sound data SD of original sound are successively received by the sound areas 51-1 to 51-n.

The interrupt signal INT may be disabled instead of executing the step 200. At a moment when the interrupt signal INT is input to the digital signal processor 11*c*, it is determined depending upon the disabling whether the routine should be jumped to the processing for producing reverberation sounds of FIG. 14 or not. When the disabling has been set, the routine does not jump to the processing of FIG. 14 at the time of inputting the interrupt signal INT. With the disabling being reset, on the other hand, the routine jumps to the processing of FIG. 14 every time when the interrupt signal INT is input.

13. Processing for Producing Reverberation Sounds (Third Embodiment)

FIG. 14 is a flow chart illustrating the processing for producing reverberation sounds according to the third embodiment. In this processing, the data Qns related to the present number of times of operating is repetitively increased for every reverberation sounds G, J (steps 256, 258). The data Qns is further repetitively increased (step 220) for every sample data of tone data SD (reverberation sound data G, J)(step 210).

After the delay times t1 and t2 have lapsed, the data SD (G, J) are read out (step 226) when the data Yn related to the number of times of delay operation is exceeded by the data Qns (step 222). The data SD (G, J) are attenuated by the coefficient Zn of attenuation (step 228) and are output (step 232). The attenuated reverberation sounds G, J are stored (step 234), and the next delay processing is prepared (step 236). The processing for producing the outputting reverberation sounds is repeated for every kind of reverberation sounds G, J (steps 256, 258) and for every sample data of the reverberation sound data G, J (steps 244 to 246).

When the interrupt signal INT of a predetermined period is input to the digital signal processor 11*c* from the interrupt generating circuit 16, the digital signal processor 11*c* discriminates whether the reverberation producing flag rgf has been set or not in the whole processing. When the reverberation producing flag rgf has been set, the processing is started for producing reverberation sounds.

First, the data Qns is increased by 1 (step 220). The data Qns is repetitively increased until it exceeds the data Yn (steps 256, 258). This increase is repeated even for other sound data SD or the reverberation sound data J (step 258). Thereafter, the data n is reset to "1" (step 260), and the routine is returned back to the whole processing.

Due to this return, the processing for receiving the sound data SD of original sound is repeated as represented by the steps 200 to 210. Moreover, subsequent sample data of the sound data SD of original sound are successively received by the sound areas 51-1 to 51-n. Thereafter, the processing for receiving the original sound and the processing for producing reverberation sounds are alternatingly repeated after every a predetermined period. Thus, the sample data of sound data SD are successively written into the sound areas 51-1 to 51-n.

When the data Qns exceeds the data Yn, the discrimination at the step 222 is NO. Furthermore, when the reverberation producing flag rof has not been set, the flag rof is set (steps 223, 224). Then, the sound data SD or the reverberation sound data G, J are read out from the address corresponding to the data s related to the number of sound samples in the sound area 51-n (step 226). The read address is an s-th one from the head of the sound area 51-n that corresponds to the data n related to the number of kinds of reverberation.

The sound data SD or the reverberation sound data G, J are multiplied by the attenuation coefficient Zn, whereby the level data of reverberation sounds G, J shown in FIG. 4 are calculated (step 228). When the sound data SD or the reverberation sound data G, J that are greater than the attenuation threshold value THn (step 230), the data SD or the data G, J are sent to the D-A converter 15 (step 232). Thus, the attenuated reverberation sounds are generated.

Then, the reverberation sound data G, J that are output are written into the sound areas 51-1 to 51-n (step 234). The write address is an s-th one from the head of the sound area 51-n that corresponds to the data n. The data Qns is reset to "0" (step 236). Thus, the processing is prepared for the next reverberation sounds G, J.

When the data n is "1", the sample data at the heads of reverberation sounds G11, G12, G13, - - - of FIG. 4 are output (step 240). The reverberation sound data G, J that are attenuated are written not only into the sound area 51-1 corresponding to the data n related to the number of kinds of reverberation but also into other sound area 51-n (step 242). The write address is an s-th one from the head of the sound area 51-n that corresponds to the data n. Then, the data Qns related to the present number of times of operating is reset to "0" (step 243). Due to this processing, a processing is prepared for the reverberation sounds J21, J31, J41, - - - that follow the reverberation sounds G11, G12, G13, - - - .

Then, the data s related to the number of sound samples is increased by 1 (step 244). The data s is reset to "0" when it has exceeded the data SS related to a maximum number of sound samples (steps 245, 246).

When the sound data SD or the reverberation sound data G, J are smaller than the attenuation threshold value THn, the discrimination at the step 230 is YES. When the data n is "1" (step 250), the reverberation-producing flag rgf and the reverberation output flag rof are cleared (step 252), and the routine is returned back to the whole processing. Thus, the processing for producing reverberation sounds is finished.

After the step 200 of the processing for receiving the original sound, the reverberation-producing flag rgf may be set if it has not been set. When the above-mentioned interrupt signal INT is to be masked, the masking is executed at the step 252.

In the first, second and third embodiments mentioned above, the expression (1) for calculating the new address value may be replaced by the following expression, $$(A \times SPn)/(TLn - ADns) + ADns \rightarrow ADns \quad (5)$$

where A is a constant.

This expression makes more fine the gap among the steps of address values over which the sound data SD are moved for every reverberation sound processing, and the delay time tn is controlled more finely.

In the operations at the steps 131 and 228, furthermore, the attenuation coefficient Zn may be subtracted from the sound data SD or the reverberation sound data G, J. This makes the attenuation characteristics αn of reverberation sounds of FIG. 4 linear. In this case, the delay speed coefficient SPn is determined depending upon the delay time tn.

In the aforementioned embodiments, furthermore, the start address ADst (FFH) and the desired address TLn (OOH) remain constant irrespective of the delay time tn. Therefore, the delay time tn can be easily adjusted by simply changing the coefficient of delay speed. Besides, there is no need to change the start address ADst or the target address TLn. In changing the delay time tn, therefore, there is no need to increase or decrease the delay areas 51-1 to 51-n, and error data does not infiltrate into the processing for producing reverberation sounds.

Here, the start address ADst (FFH) and the target address TLn (OOH) or the address threshold value TAn may be changed depending upon a change in the delay time tn. Therefore, the delay time tn is greatly changed while the delay speed coefficient SPn is maintained constant.

The operations of the steps 124 and 220 are carried out for every data s. Here, however, the values corresponding to the sample data at the heads or the values ADn1, Qn1 corresponding to representative sample data only may be operated, and the sample data corresponding to other values ADns, Qns (s>1) may be processed incidentally. In this case, the flag is set when TAn and Yn are exceeded by ADns and Qns at the steps 127 and 222. Then, the setting of the flag is discriminated at a next timing. When the flag has been set, the steps 128 to 146 or the steps 223 to 246 are repeated. After the data s related to the number of sound samples is increased, the above-mentioned flag is cleared at the steps 146 and 246.

The processing for producing reverberation sounds may not be executed after every predetermined period. In this case, the time data programmed in a programmable timer undergoes a change successively. The programmable timer generates an interrupt signal INT depending upon the time data.

The multiplication and addition in the above-mentioned operation can be changed into division and subtraction using a value of not larger than 1 and a minus value. Moreover, the data in the above-mentioned operation may be subjected to multiplication, division, addition or subtraction by constants.

The following processing can be further executed. That is, as the sound data SD of original sound are input via the AD converter 14, the digital data of original sound are written by the central processing unit (CPU) into a head address OOH of the delay (sound) area 51. Interrupt is issued to the CPU after every predetermined time interval to execute the next processing. When the interrupt is issued to the CPU, the sound data SD at the head address of RAM is moved to an address maintaining a predetermined gap and is written therein. Every time when the interrupt is issued, therefore, the sound data SD are successively moved to the addresses maintaining a predetermined gap. Finally, the sound data SD are moved to a final address (e.g., FFH) of the delay (sound) area 51.

As the write address (present value) of sound data SD arrives at the final address (target value), this fact is detected by the CPU. Then, the sound data SD are multiplied by a coefficient of attenuation and are output through the D/A converter 15. Moreover, the sound data SD multiplied by the coefficient of attenuation are written again into the head address of the delay (sound) area 51. Every time when the interrupt is issued, furthermore, the address for writing the sound data SD is updated successively. Thereafter, these processings are repeated. Thus, there are produced (generated) reverberation sounds that attenuate by a predetermined amount after every predetermined period of time in the same manner as in FIG. 14.

In FIG. 14, furthermore, when the interrupt is issued to the CPU after every predetermined time interval and the interval for generating reverberation sounds is changed, it becomes necessary to change the start address or the final address of sound data that are written into the delay (sound) area 51. This results in an increase or a decrease in the delay (sound) area 51. When the size of the storage region is increased, however, there may remain undesired data in the storage region. It is further expected that undesired data may infiltrate into the processing for producing reverberation sounds. When the storage region is to be increased or decreased, furthermore, a large storage region must have been incorporated in the step of producing the device, so that a sufficiently large storage region is obtained. However, use of the memory having such a large capacity drives up the cost of the device.

The number of the delay areas (sound areas) 51-n may exceed the number of kinds of reverberation sounds. For instance, the delay areas (sound areas) may be provided in a number in excess of 1 for one kind of reverberation sounds J, G. In this case, the write processing is repeated like when sound data SD is written into the first area, reverberation sound data J11 is written into the second area, reverberation sound data J12 is written into the third area, reverberation sound data J13 is written into the fourth area, reverberation sound data J14 is written into the first area again, reverberation sound data J15 is written into the second area again, - - - . Therefore, when the sound data SD and reverberation sound data J, G are partly overlapped in time, the processing for producing reverberation sounds is carried out more easily.

14. Processing for Producing Early Reflection Sound According to a Further Embodiment (Fourth Embodiment)

The above-mentioned first to third embodiments of the processing for producing subsequent reverberation sounds can be adapted even to the processing for producing the early reflection sound. Then, the early reflection sound changes maintaining attenuation characteristics as represented by J11 to J1n in FIG. 4. The early reflection sound consists of a plurality of sounds. In this case, the processings of FIGS. 10, 12 and 14 are executed instead of the processing of FIG. 9. The processings for receiving the original sound of FIGS. 8, 11 and 13 are executed in the processing for producing the early reflection sound. A group of registers of FIG. 6 are provided for executing the processing for producing the early reflection sound.

The address threshold value THn of the early reflection sound, attenuation threshold value THn, delay speed coefficient SP and attenuation coefficient Z are different from those of the subsequent reverberation sound. Therefore, the early reflection sound is produced (generated) having characteristics different from those of the subsequent reverberation sound. For instance, the values of one side may be larger than those of the other side, or these values may often be the same.

When a plurality of early reflection sounds are to be produced (generated), this processing is executed for each of the early reflection sounds. Moreover, this processing is executed by one or a plurality of digital signal processors that are provided separately from the digital signal processors for producing the subsequent reverberation sound. When the address threshold value THn of the early reflection sound, attenuation threshold value THn, delay speed coefficient SP and attenuation coefficient Z are larger than those of the subsequent reverberation sounds, the time zone for generating the early reflection sound becomes shorter.

15. Embodiment for Controlling the Envelopes (Fifth Embodiment)

In the above-mentioned first embodiment, the early reflection sounds R1, R2 and the subsequent reverberation sound P are produced (generated) by different processing devices in different modes. In the fifth embodiment as will be described below, furthermore, envelopes of the early reflection sounds R1, R2 and of the subsequent reverberation sound P are controlled. In the fifth embodiment, the same constituent portions and the same processings as those of the first embodiment are denoted by the same reference numerals.

The whole circuitry of the fifth embodiment is the same as that of the first embodiment and is shown in FIG. 1. Therefore, the circuits of the digital signal processors 11*a*, 11*b* and 11*c* are shown in FIG. 2. Furthermore, the early reflection sounds R1, R2 and the subsequent reverberation sound P according to the fifth embodiment are shown in FIGS. 3 and 4.

16. A Group of Registers Used for the Delay Processing (Fifth Embodiment)

Figure 15:
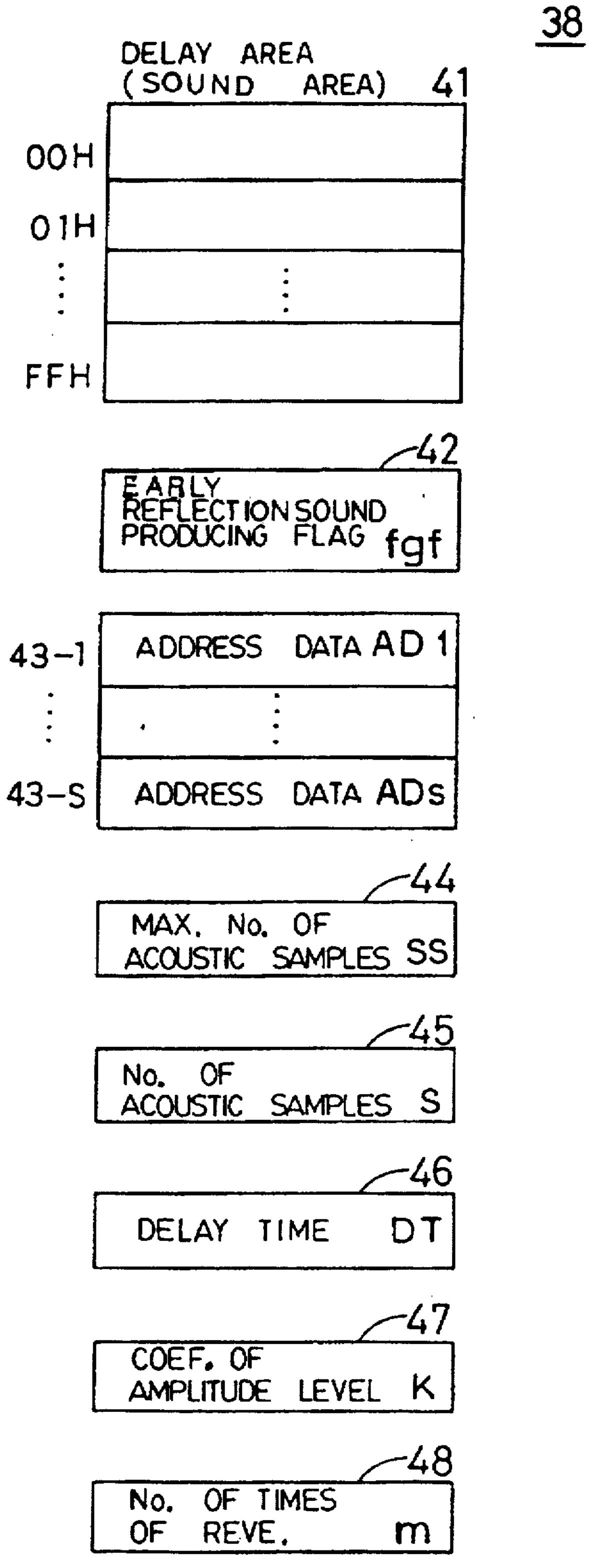
FIG. 15 is a diagram illustrating a group of registers for delay processing in a data RAM 38 in the digital signal processors 11*a*, 11*b* according to a fifth embodiment.

FIG. 15 is a diagram illustrating a group of registers provided in the data RAM 38 or the processing RAM 12 in the digital signal processors 11*a*, 11*b*. These registers store a variety of data used for the processing for producing early reflection sounds R1, R2. In the fifth embodiment, a number of times of reverberation register 48 is added to the group of registers of the first embodiment shown in FIG. 5. A number m of times of reverberation is set to the number of times of reverberation register 48. The number m of times of reverberation represents values of the early reflection sounds and of the subsequent reverberation sounds Jll, J12, J13, - - - , J21, J22, J23, - - - , G11, G12, G13, - - - shown in FIG. 4. The number m may represent values which are different between J and G, or may represent the same value. The group of registers provided in the data RAM 38 or in the processing RAM 12 of the digital signal processor 11*c* are the same as those of the first embodiment, and are shown in FIG. 6. The digital signal processor 11*c* is a processing device for producing the subsequent reverberation sound.

Various data stored in the group of registers to produce subsequent reverberation sound may have been stored in advance in the electronic sound device. These data may be set, rewritten or changed by the operator by using a group of panel switches 3 or the keyboard 1. Or, these data may be set or rewritten by the signals input from other device through the MIDI terminal. Or, these data may be converted from the musical factor data in the automatic play data that are played back.

The musical factor data include tone pitch, tone pitch range, kind of timbre, content of harmonic components, quantity of touch, kind and/or loudness of effect (reverberation, echo, glide, portamento, etc.), position of sound image, kind of rhythm, part of play (melody, chord, base, background, rhythm), amount of modulation, envelope level, envelope speed, envelope phase, lapse of sounding time, volume, number of sound generations, quantizing quantity, tempo, filter characteristics data, number m of times of reverberation, etc. Therefore, the delay times D1, D2 of the early reflection sounds R1 and R2, coefficients K1, K2 of amplitude level, and delay times t, T or attenuation characteristics α of the subsequent reverberation sounds G, J, change depending upon the musical factors.

Like in the first embodiment, furthermore, the above-mentioned musical factor data include lapse of time from the start of sounding. In this case, a channel is assigned to the sound data SD. The time counter is constituted in the same manner as in the first embodiment, and the time of the channel is counted in a time-divisional manner.

17. A Group of Registers Used for Controlling the Envelopes (Fifth Embodiment)

Figure 16:
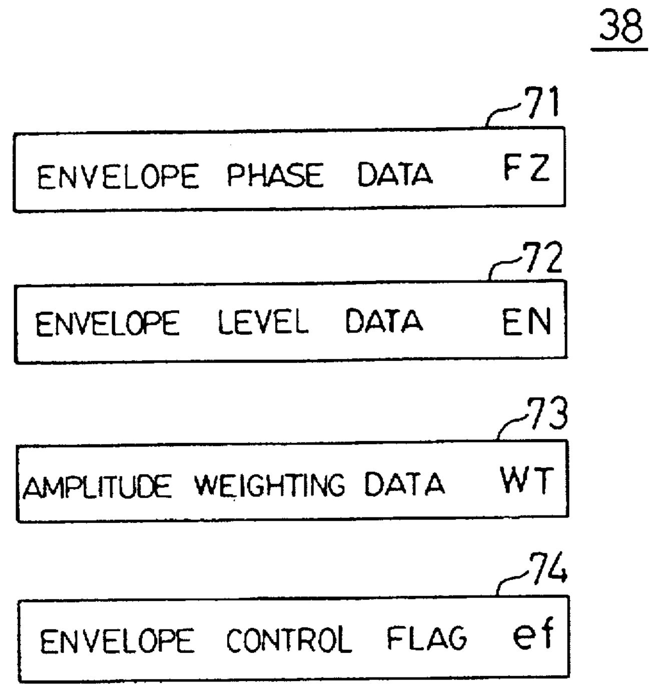
FIG. 16 is a diagram illustrating a group of registers for controlling envelope by the digital signal processors 11*a*, 11*b*, 11*c* according to the fifth embodiment.

The above-mentioned first early reflection sound R1, second early reflection sound R2 and subsequent reverberation sound P have envelopes, respectively. In the fifth embodiment, these envelopes are controlled and various sound effects are produced (generated). Various coefficient data are stored in the digital signal processors 11*a*, 11*b* and 11*c*. These coefficient data are used for controlling the envelopes. FIG. 16 illustrates groups 71 to 73 of registers for controlling envelopes and a data table 80. These groups 71 to 73 of registers and the data table 80 are provided in the coefficient RAMs 38 in the digital signal processors 11*a*, 11*b* and 11*c*. The groups 71 to 73 of registers and the data table 80 may be provided in the processing RAMs 12.

The envelope phase register 71 stores envelope phase data FZ. The envelope phase data FZ is set to "01" in the attack phase, set to "11" in the decay phase (sustain phase), set to "10" in the release phase, and is set to "00" when the envelope level assumes "0". The envelope level register 72 stores the envelope level data EN. The weight register 73 stores weighting data WT of amplitude. The envelope control mode register 74 stores an envelope control flag ef which indicates whether the envelopes should be controlled or not.

The data table 80 stores the target level data MT and speed data ES for each of the musical factors and for each of the number m of times of reverberation (envelope phases). The musical factor data include tone pitch, tone pitch range, kind of timbre, quantity of touch, kind and/or loudness of effect (reverberation, echo, glide, portamento, etc.), position of sound image, kind of rhythm, part of play (melody, chord, base, background, rhythm), amount of modulation, lapse of sounding time, volume, quantizing quantity, tempo, filter characteristics data, etc.

The data table 80 in the digital signal processor 11*c* is provided with a data table 80G and a data table 80J. The data table 80G is used for the reverberation sound G. The data table 80J is used for the reverberation sound J. The data tables 80G and 80J store target level data MT and speed data ES. These data MT and ES determine the envelopes of the reverberation sound data G, J. The weight register 73 in the digital signal processor 11*c* stores amplitude weighting data WT1 of reverberation sound data G and amplitude weighting data WT2 of reverberation sound data J. Similarly, the envelope level register 72 stores the envelope level data EN1 of reverberation sound data G and the envelope level data EN2 of reverberation sound data J.

18. Processing for Receiving the Original Sound (Fifth Embodiment)

The processings for receiving the original sound of early reflection sound and subsequent reverberation sound in the fifth embodiment are the same as the processings of the first embodiment, and are shown in FIGS. 7 and 8.

19. Processing for Producing the Early Reflection Sound (Fifth Embodiment)

Figure 17:
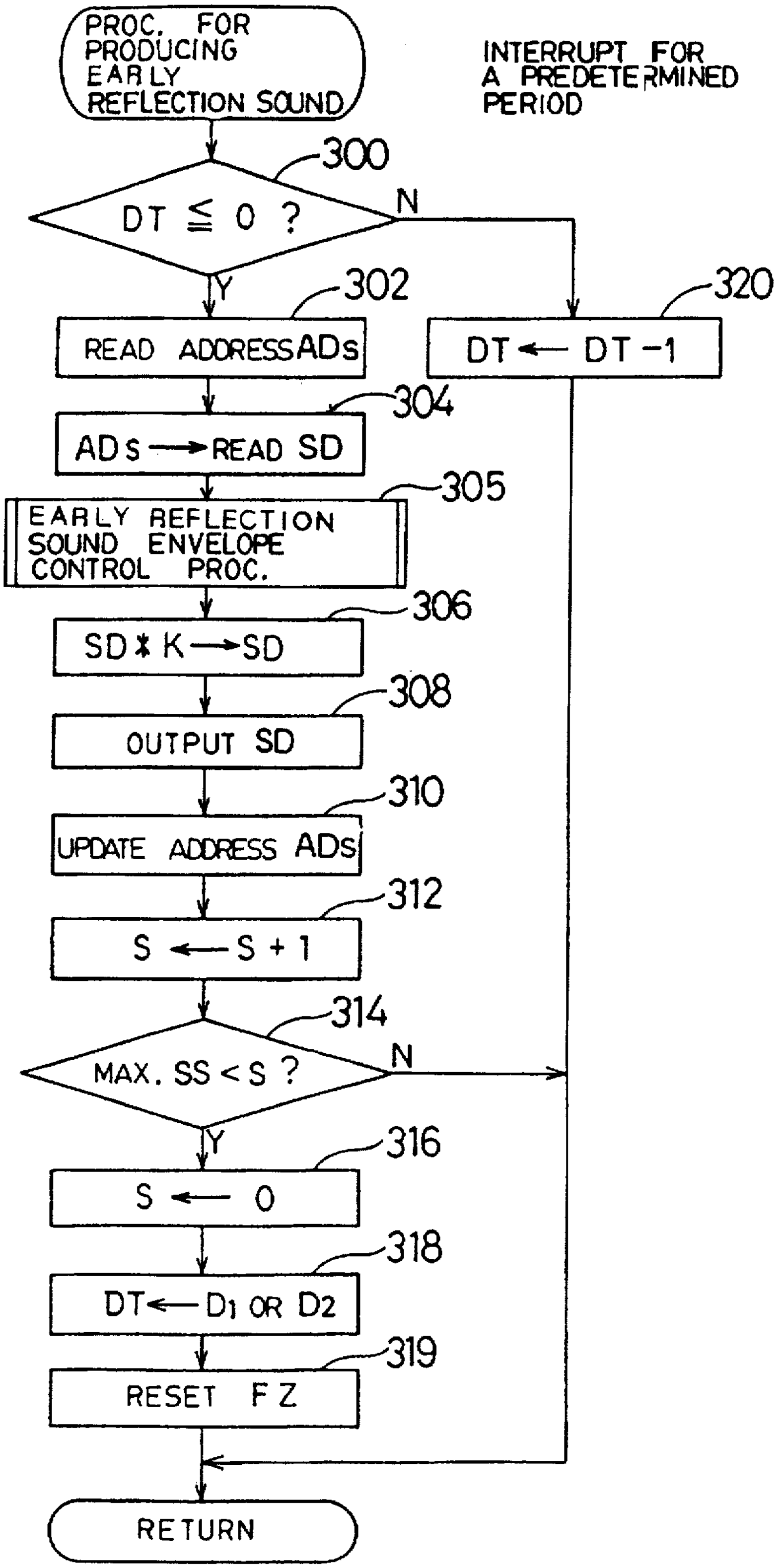
FIG. 17 is a flow chart of a processing for producing early reflection sound executed by the fifth embodiment.

FIG. 17 is a flow chart illustrating the processing for producing the early. reflection sound according to the fifth embodiment. In this processing, steps 305 and 319 are added to the processing for producing the early reflection sound of the first embodiment shown in FIG. 9. The step 305 controls the envelopes of the early reflection sounds R1 and R2, and the step 319 resets the envelope phase data FZ.

20. Processing for Producing the Subsequent Reverberation Sounds (Fifth Embodiment)

Figure 18:
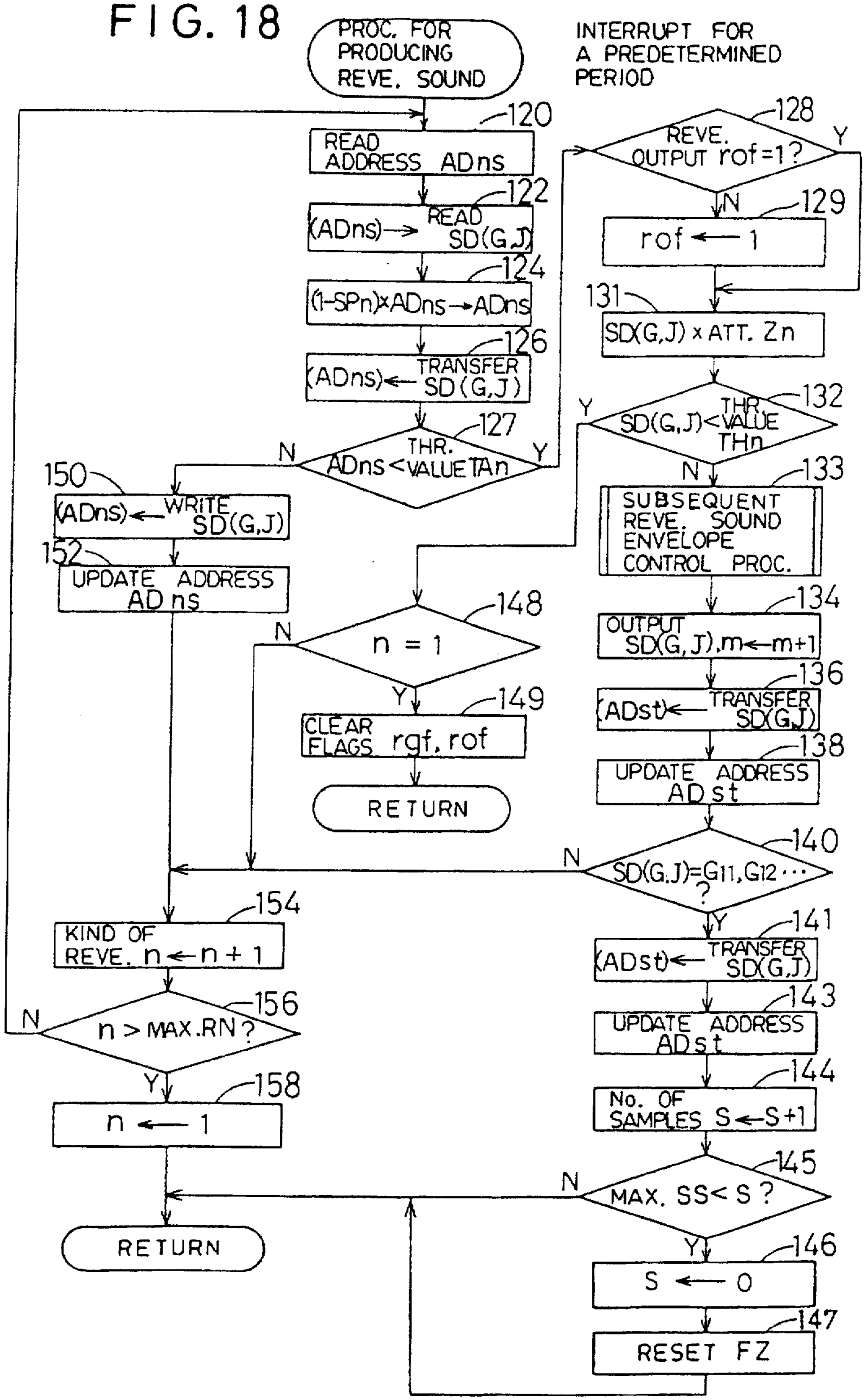
FIG. 18 is a flow chart of a processing for producing subsequent reverberation sound executed by the fifth embodiment.

FIG. 18 is a flow chart illustrating the processing for producing the subsequent reverberation sounds according to the fifth embodiment. In this processing, steps 133 and 147 are added to the processing for producing the subsequent reverberation sounds of the first embodiment shown in FIG. 10. The step 133 controls the envelope of the subsequent reverberation sounds G, J, and the step 147 resets the envelope phase data FZ.

21. Processing for Controlling the Envelopes of the Early Reflection Sounds (Fifth Embodiment)

Figure 19:
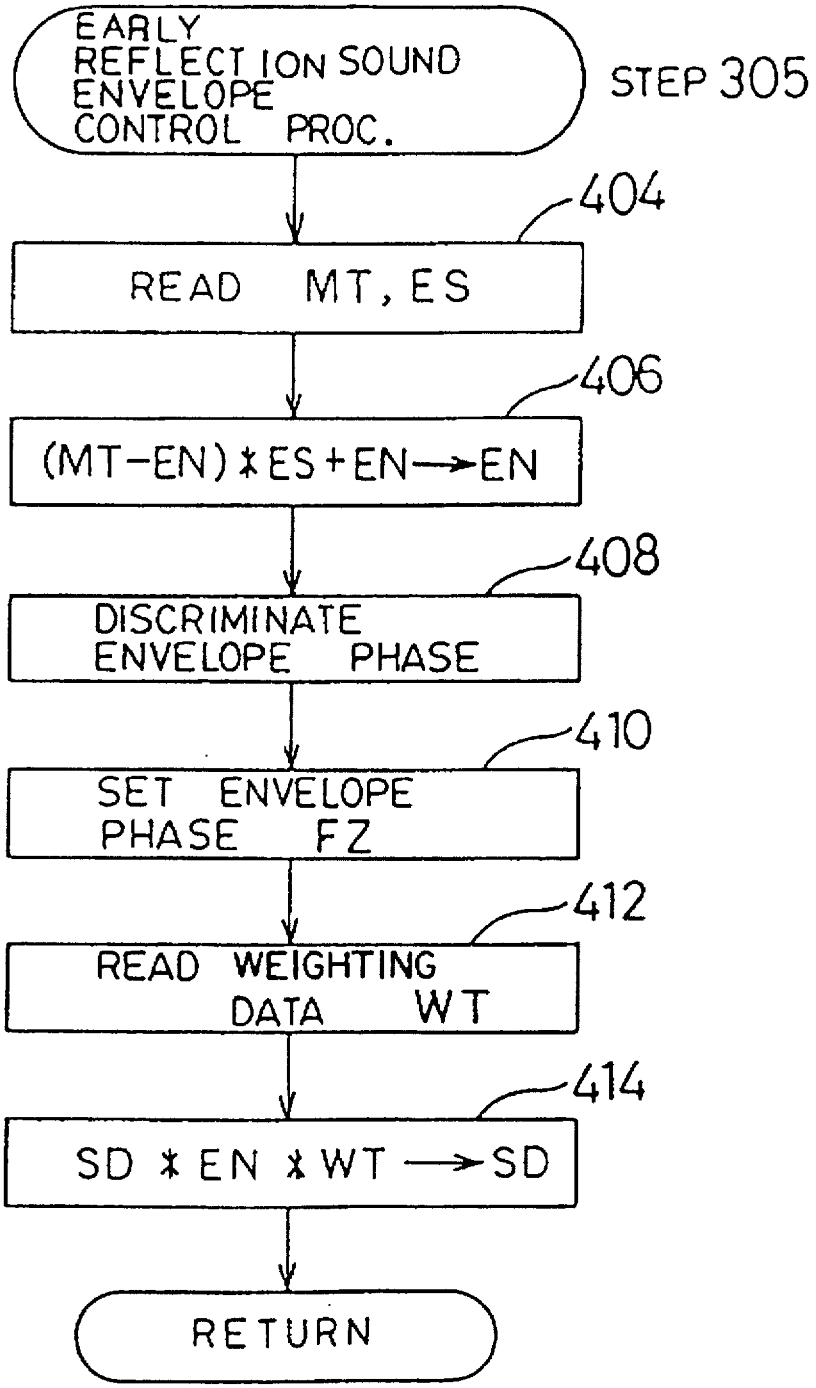
FIG. 19 is a flow chart of an early reflection sound envelope control processing executed by the digital signal processors 11*a*, 11*b* according to the fifth embodiment.

FIG. 19 is a flow chart of the processing for controlling the envelopes of the early reflection sounds (step 305). First, the target level data MT and the speed data ES are read out from the data table 80 (step 404). The target level data MT and the speed data ES are read out from an address corresponding to the envelope phase based upon the envelope phase data FZ and the number m of times of reverberation. The address for reading these data MT and ES is also determined depending upon the musical factors. The envelope level EN of the early reflection sounds R1 or R2 is calculated by using these data MT and ES. The calculation is executed in compliance with, for example, the following expression, $$(MT-EN)\times ES+EN\rightarrow EN \tag{6}$$

The new envelope level data EN found in compliance with the expression (6) is updated to the envelope level register 72 (step 406).

Then, the envelope phase is discriminated (step 408). It is discriminated at the step 408 whether the difference between the envelope level EN and the target level MT is not larger than a predetermined value or not. The target level MT has been determined for each of the envelope phases. The envelope level EN increases or decreases depending upon the operation in compliance with the expression (6), and approaches the target level MT. When the difference between the envelope level EN and the target level MT is not larger than the predetermined value, the envelope phase is changed into the next phase. The change of the phase is carried out in the order of attack phase, decay phase (sustain phase) and release phase.

Then, the envelope phase data FZ corresponding to the envelope phase is set to the register 71 (step 410). The envelope phase data FZ is "01" in the attack phase, "10" in the decay phase (sustain phase), and is "11" in the release phase. When reset, furthermore, the envelope phase data FZ is "00".

Next, the amplitude weighting data WT are read out (step 412). Then, the tone data SD are multiplied by the envelope level EN and by the amplitude weighting data WT (step 414). Thus, the tone data SD are weighted and are further controlled for their envelopes. The tone data SD are updated to the delay area 41 (step 414).

The envelope level EN is a coefficient for changing the shape of envelope of sound data SD of original sound. The envelope level EN changes toward the target level MT at an envelope speed ES. Therefore, the envelope level EN changes accompanying changes in the MT and ES. As described earlier, furthermore, the sound data SD of original sound are multiplied by the envelope level data EN. Therefore, the shape of envelope of sound data SD of original sound changes depending upon the envelope level data EN. Hence, the shapes of envelopes of the early reflection sounds R1 and R2 are different from the shape of envelope of the original sound.

The target level data MT, speed data ES and amplitude weighting data WT used in the digital signal processor **11*a* have values different from the values of such data used in the digital signal processor 11*b***. Accordingly, the first early reflection sound R1 and the second early reflection sound R2 are formed (generated) from the same sound data SD. These two tone data have different envelopes. The weighting data WT may have a correlation between the first early reflection sound R1 and the second early reflection sound R2, or may be determined independently of each other.

22. Processing for Controlling the Envelopes of the Subsequent Reverberation Sounds (Fifth Embodiment)

Figure 20:
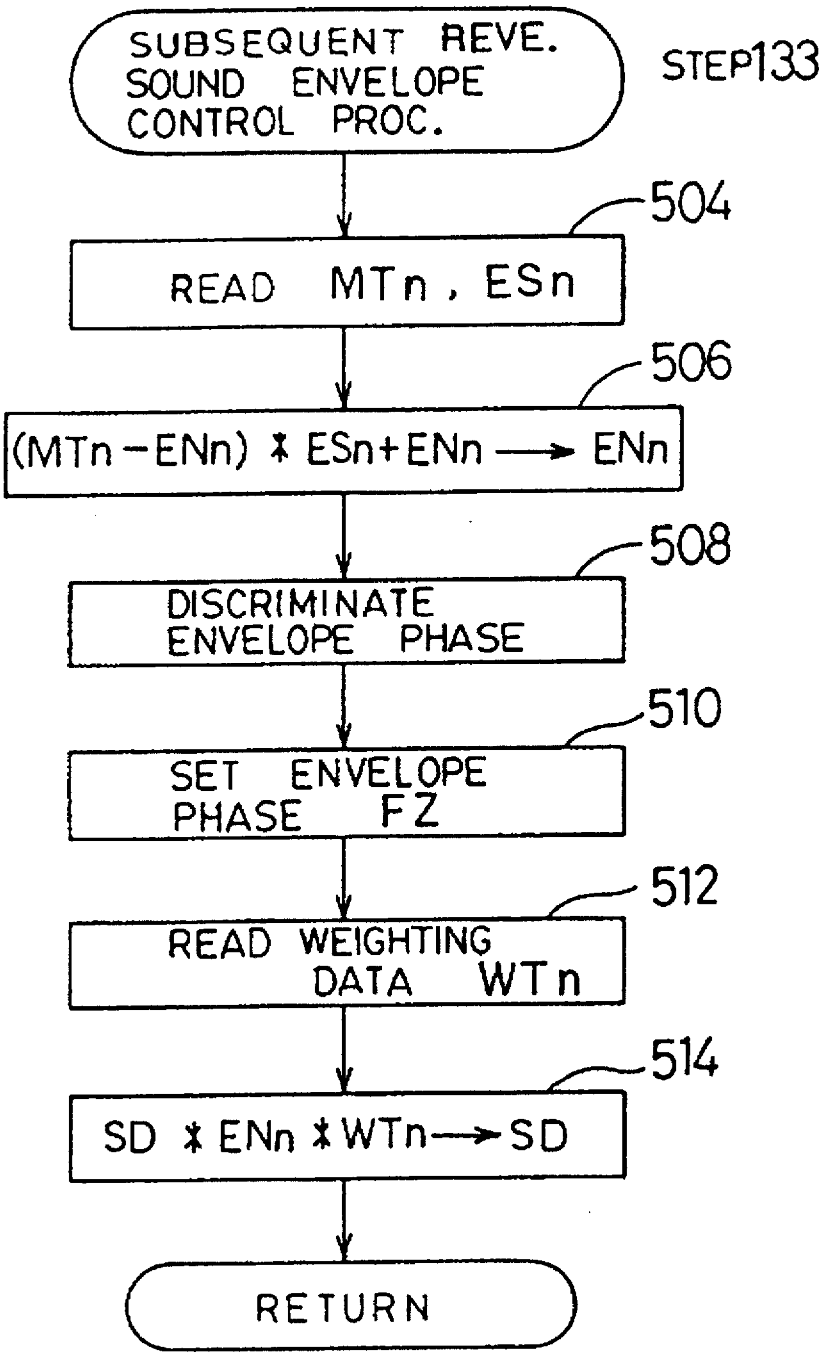
FIG. 20 is a flow chart of a subsequent reverberation sound envelope control processing executed by the digital signal processor 11*c* according to the fifth embodiment.

FIG. 20 is a flow chart of a processing for controlling the envelope of the subsequent reverberation sound (step 133). This processing is executed nearly in the same manner as the above-mentioned processing for controlling the envelope of the early reflection sound (step 305). The subsequent reverberation sound P is formed (generated) from two kinds of reverberation sound data G, J. Therefore, this processing for controlling the envelope forms envelopes for the two kinds of reverberation sound data G, J.

First, the target level data MTn and the speed data ESn are read out from the data tables 80G, 80J in the coefficient RAM 38 in the digital signal processor **11*c* (step 504**). These target level data MTn and the speed data ESn are read out from an address determined by the envelope phase data FZ and the number m of times of reverberation. The address for reading these data MT and ES is also determined by the musical factors. The envelope level ENn of reverberation sounds G, J is calculated by using these data MTn and ESn in compliance with, for example, the following expression, $$(MTn-ENn)\times ESn+ENn\rightarrow ENn \tag{7}$$

The new envelope level data ENn found in compliance with the expression (7) is updated to the envelope level register 72 (step 506).

Then, the envelope phase is discriminated (step 508). At the step 508, it is discriminated whether the difference between the envelope level ENn and the target level MTn is not larger than a predetermined value. The target level MTn is determined for each of the envelope phases. The envelope level ENn increases or decreases in compliance with the expression (7) and approaches the target level MTn. When the difference between the envelope level ENn and the target level MTn is not larger than the predetermined value, the envelope phase is changed over to the next phase. Then, the envelope phase data FZ is set depending upon the envelope phase (step 510).

Next, the amplitude weighting data WTn are read out (step 512). Then, the tone data SD are multiplied by the envelope level ENn and amplitude weighting data WTn (step 514). Thus, the tone data SD are weighted and controlled for their envelopes. The tone data SD are updated to the delay area 51-n (step 514).

According to the fifth embodiment as described above, the two early reflection sounds R1, R2 and the subsequent reverberation sound P are produced (generated) by using separate processing devices **11*a*, 11*b* and 11*c***. Therefore, the early reflection sounds R1, R2 and the subsequent reverberation sound P are produced (generated) in different modes. Furthermore, the envelopes of the early reflection sounds R1, R2 and of the subsequent reverberation sound are controlled independently of each other.

The processings (steps 305, 133) for controlling the envelopes of the early reflection sound and of the subsequent reverberation sound may be independent interrupt processings.

23. Processing for Controlling the Envelopes by Adding Fluctuation Effect (Sixth Embodiment)

Figure 21:
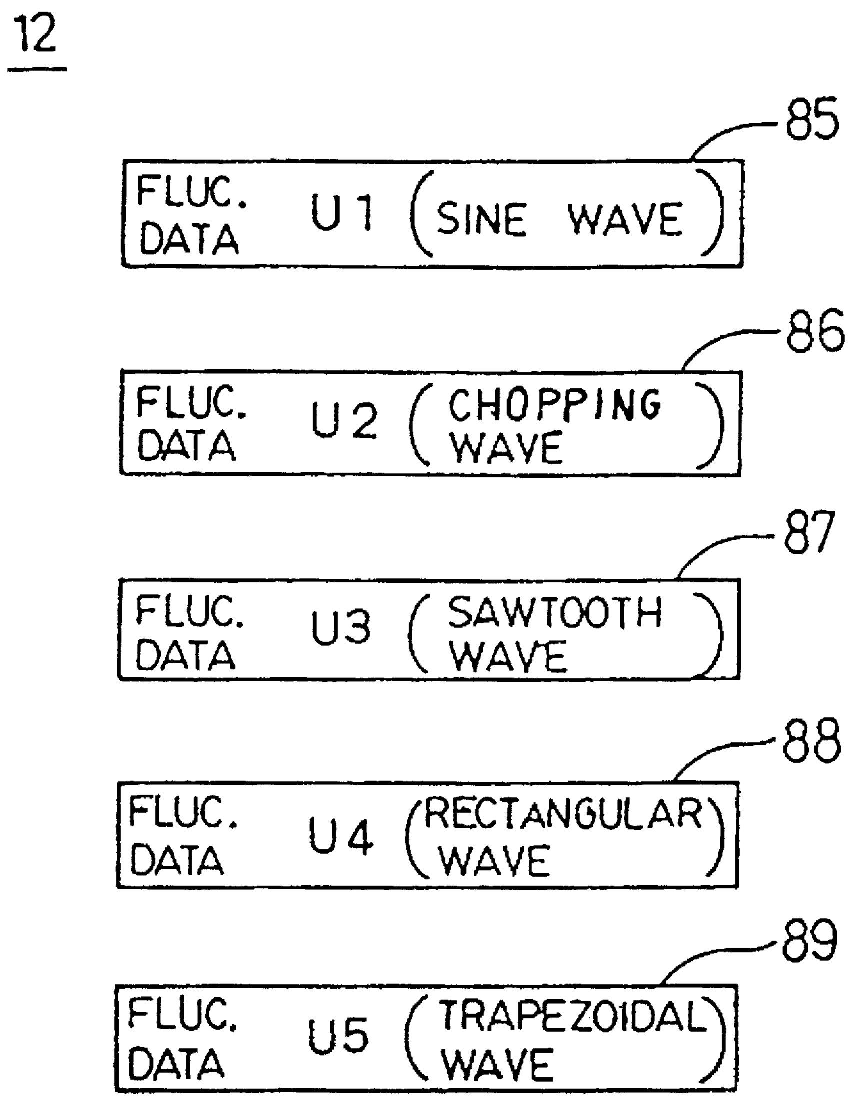
FIG. 21 is a diagram illustrating a group of fluctuation data registers in a processing RAM 12 according to a sixth embodiment.

In the sixth embodiment, fluctuation effect is added to the early reflection sounds R1, R2 and to the subsequent reverberation sound P. The fluctuation effect occurs as the envelopes undergo swinging. In the sixth embodiment as shown in FIG. 21, the fluctuation data registers 85 to 89 are provided in the processing RAM 12.

The fluctuation data registers 85 to 89 store different fluctuation data U (U1 to U5). The fluctuation data U have waveforms which are time-divided, the waveforms having amplitudes that change periodically. In this embodiment, five kinds of fluctuation data U1 to U5 are stored, i.e., sine wave, chopping wave, sawtooth wave, rectangular wave and trapezoidal wave.

Figure 22:
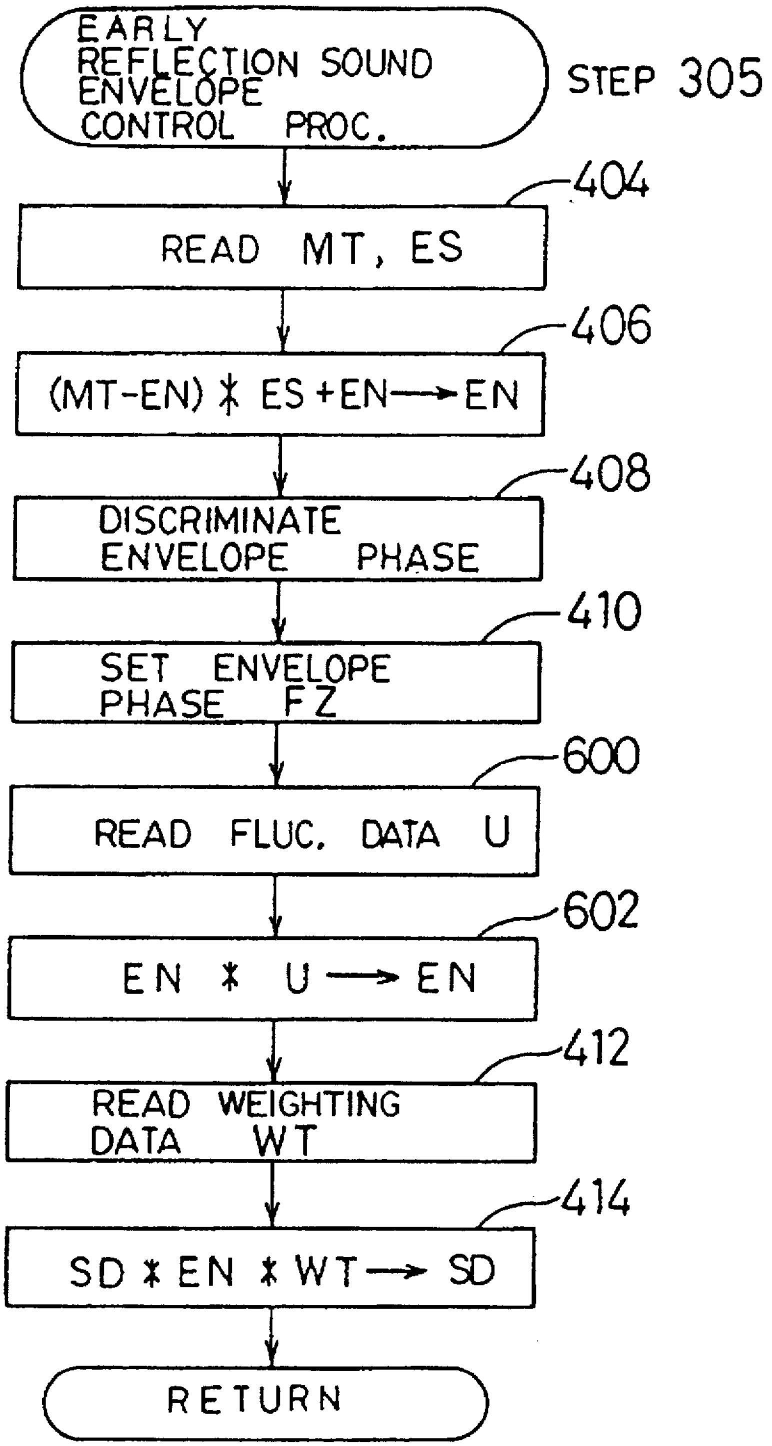
FIG. 22 is a flow chart of an early reflection sound envelope control processing executed by the sixth embodiment.
Figure 23:
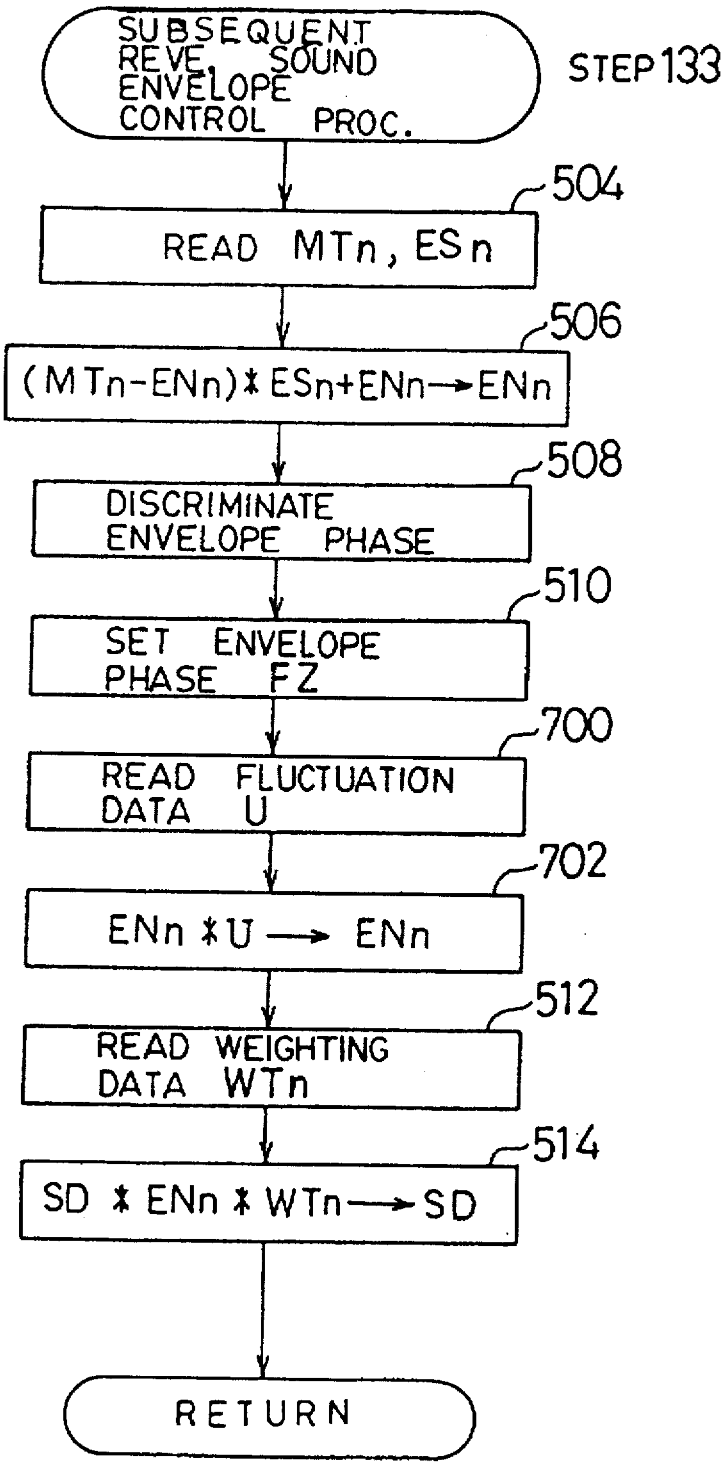
FIG. 23 is a flow chart of a subsequent reverberation sound envelope control processing executed by the sixth embodiment.

FIG. 22 is a flow chart of a processing for controlling the envelopes of the early reflection sounds to which the fluctuation effect processing is added. FIG. 23 is a flow chart of a processing for controlling the envelopes of the subsequent reverberation sounds to which the fluctuation effect processing is added. In the processing shown in FIG. 22, steps 600 and 602 are added to the processing of FIG. 19. In the processing shown in FIG. 23, steps 700 and 702 are added to the processing shown in FIG. 20. In FIGS. 22 and 23, the steps that execute the same processings as those of the steps of FIGS. 19 and 20 are denoted by the same reference numerals.

The step 406 or 506 executes the operation of the envelope level data EN, ENn. Then, the fluctuation data U is read out (steps 600, 700). The fluctuation data U is the one selected from the fluctuation data U1 to U5. The fluctuation data U1 to U5 are selected by manipulating the group of panel switches 3. The selected fluctuation data are successively read out starting from the head data.

Next, the envelope level data EN, ENn are multiplied by the fluctuation data U (steps 602, 702). The processing for producing the early reflection sound or the processing for producing the subsequent reverberation sound is repeated until S>SS is accomplished. Then, the envelope levels EN, ENn of the early reflection sounds R1, R2 and of the subsequent reverberation sounds G, J undergo the swinging accompanying the vibration of the fluctuation data U. Therefore, fluctuating sound is added to the early reflection sounds R1, R2 and to the subsequent reverberation sounds G, J. The fluctuating sound is not contained in the sound data SD of original sound but is produced (generated) by the processings shown in FIGS. 22 and 23.

In the sixth embodiment, the constitutions and processings are the same as those of the fifth embodiment except those shown in FIGS. 21, 22 and 23.

24. Seventh Embodiment

The processings for controlling the envelopes shown in FIGS. 19, 20, 22 and 23 can be added to the second embodiment mentioned earlier. In this case, the processing for receiving the original sound of early reflection sound is the same as the processing shown in FIG. 8. The processing for receiving the original sound of subsequent reverberation sound is the same as the processing shown in FIG. 11. The processing for producing the early reflection sound is the same as the processing shown in FIG. 17.

Figure 24:
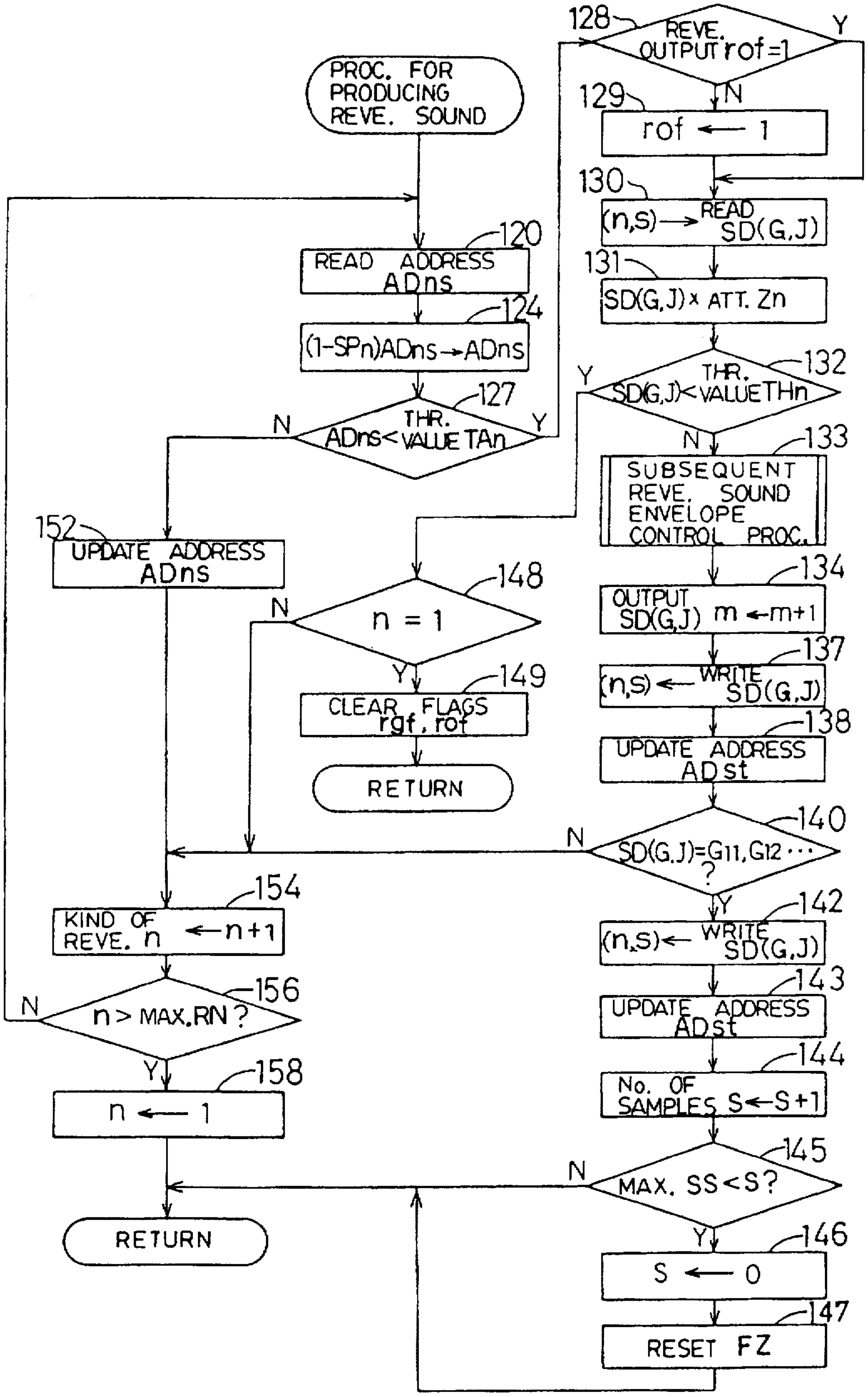
FIG. 24 is a flow chart of a processing for producing reverberation sound executed by the seventh embodiment.

The processing for producing the subsequent reverberation sound is shown in FIG. 24. In the processing for producing the subsequent reverberation sounds, steps 133 and 147 are added to the processing of the second embodiment shown in FIG. 12. In FIG. 24, the steps for executing the same processings as those of the steps of FIG. 12 are denoted by the same reference numerals. At a step 133, the envelopes of the subsequent reverberation sounds G, J are controlled. The processing for controlling the envelopes executed at the step 133 is the one shown in FIG. 20 or 23. The envelope phase data FZ is reset at the step 147.

In the seventh embodiment, the effects based upon controlling the envelopes and the fluctuation effect are obtained in addition to the effects of the aforementioned second embodiment.

25. Eighth Embodiment

The processings for controlling the envelopes shown in FIGS. 19, 20, 22 and 23 can be added to the third embodiment mentioned earlier. In this case, the processing for receiving the original sound of early reflection sound is the same as the processing of FIG. 8. The processing for receiving the original sound of subsequent reverberation sound is the same as the processing of FIG. 13, and the processing for producing the early reflection sound is the same as the processing shown in FIG. 17.

Figure 25:
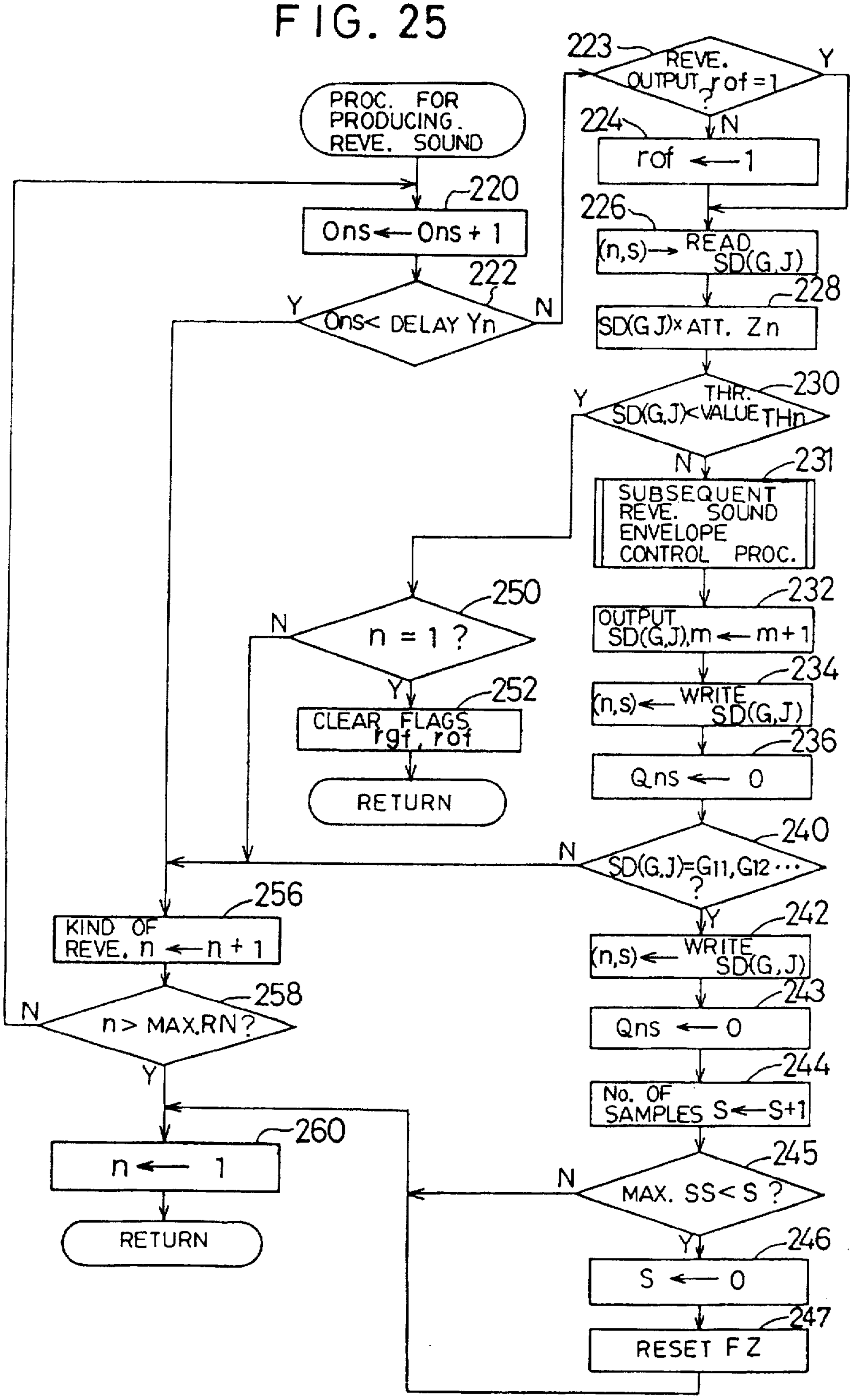
FIG. 25 is a flow chart of a processing for producing reverberation sound executed by the eighth embodiment.

The processing for producing the subsequent reverberation sound is shown in FIG. 25. In the processing for producing the subsequent reverberation sound, steps 231 and 247 are added to the processing of the third embodiment shown in FIG. 14. In FIG. 25, the steps for executing the same processings as those of the steps of FIG. 14 are denoted by the same reference numerals.

At a step 231, the envelopes of the subsequent reverberation sounds G, J are controlled. The processing for controlling the envelopes executed at the step 231 is the one shown in FIG. 20 or 23. The envelope phase data FZ is reset at the step 247.

In the seventh embodiment, the effects based upon controlling the envelopes and the fluctuation effect are obtained in addition to the effects of the aforementioned third embodiment.

26. Ninth Embodiment

The processings for producing subsequent reverberation sounds shown in FIGS. 18, 24 and 25 can be adapted even to the processing for producing the early reflection sound. Then, the early reflection sound changes maintaining attenuation characteristics as represented by J11 to J1n in FIG. 4. The early reflection sound consists of a plurality of sounds. In this case, the processings of FIGS. 18, 24 and 25 are executed instead of the processing of FIG. 17. The processings for receiving the original sound of FIGS. 8, 11 and 13 are executed in the processing for producing the early reflection sound. A group of registers of FIG. 6 are provided for executing the processing for producing the early reflection sound.

The address threshold value THn of the early reflection sound, attenuation threshold value THn, delay speed coefficient SP and attenuation coefficient Z are different from those of the subsequent reverberation sound. Therefore, the early reflection sound is produced (generated) having characteristics different from those of the subsequent reverberation sound. For instance, the values of one side may be larger than those of the other side, or these values may often be the same.

When a plurality of early reflection sounds are to be produced (generated), this processing is executed for each of the early reflection sounds. Moreover, this processing is executed by one or a plurality of digital signal processors that are provided separately of the digital signal processors for producing the subsequent reverberation sound. When the address threshold value THn of the early reflection sound, attenuation threshold value THn, delay speed coefficient SP and attenuation coefficient Z are larger than those of the subsequent reverberation sounds, the time zone for generating the early reflection sound becomes shorter.

Moreover, the envelopes are controlled, and the envelopes of the early reflection sounds R1, R2 and of the subsequent reverberation sounds G, J are controlled by different processing devices 11*a*, 11*b* and 11*c*. Therefore, different envelopes are imparted to the early reflection sounds R1, R2 and to the subsequent reverberation sounds G, J.

27. Embodiment to which a Digital Filter Is Added (Tenth Embodiment)

In the tenth embodiment, the filtering processing is executed for the sound data SD and/or the reverberation sound data G, J. This improves the quality of sound effect. Moreover, the sound effect can be changed by changing the filtering coefficient.

Figure 26:
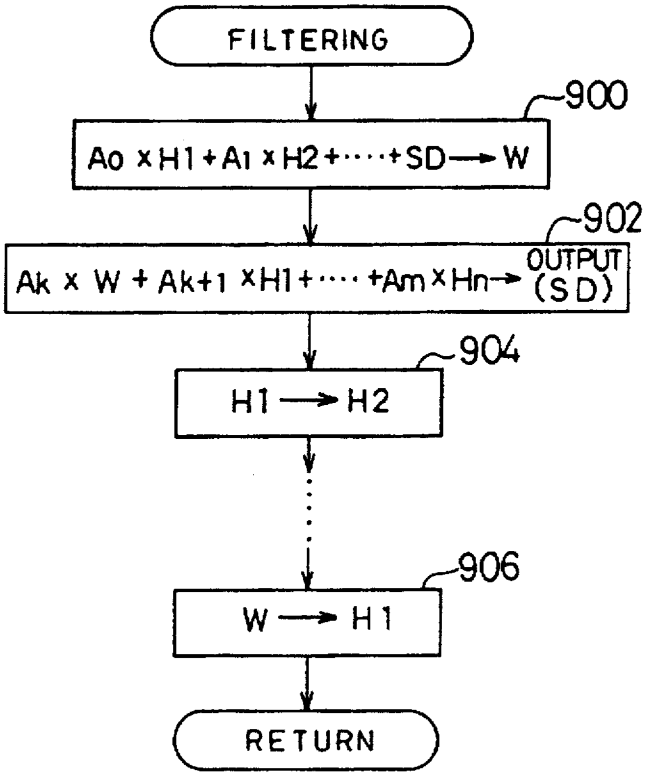
FIG. 26 is a flow chart illustrating a processing of filtering.
Figure 27:
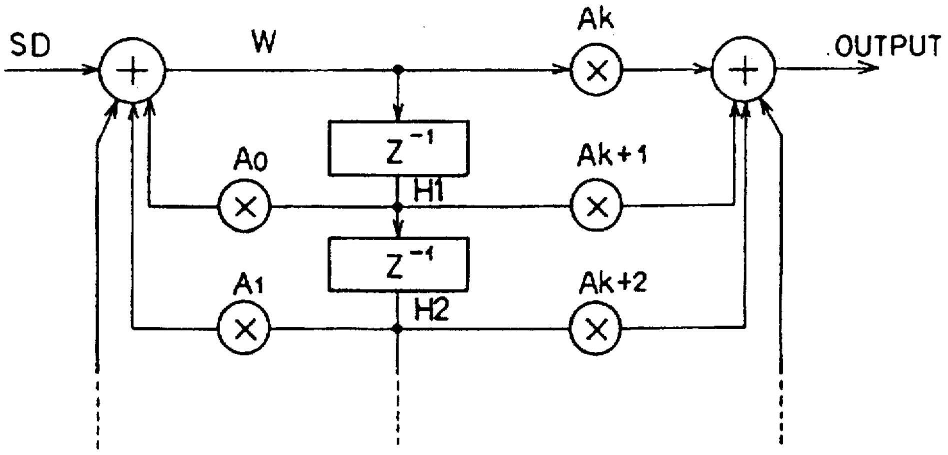
FIG. 27 is a diagram of an equivalent circuit for executing the processing of filtering shown in FIG. 26.

FIG. 26 is a flow chart of the filtering processing, and FIG. 27 is a diagram of an equivalent circuit for the filterring processing. The filter circuit shown in FIG. 27 is a IIR (Infinite Impulse Response)-type digital filter. The filtering processing shown in FIG. 26 is added after the step 126, 131 or 132 in the processing for producing reverberation sound shown in FIGS. 10 and 18. In the processing for producing reverberation sound shown in FIGS. 12 and 24, the filtering processing is added after the step 124, 131 or 132. In the processing for producing reverberation sound shown in FIGS. 14 and 25, the filtering processing is added after the step 220, 228 or 230.

Figure 28:
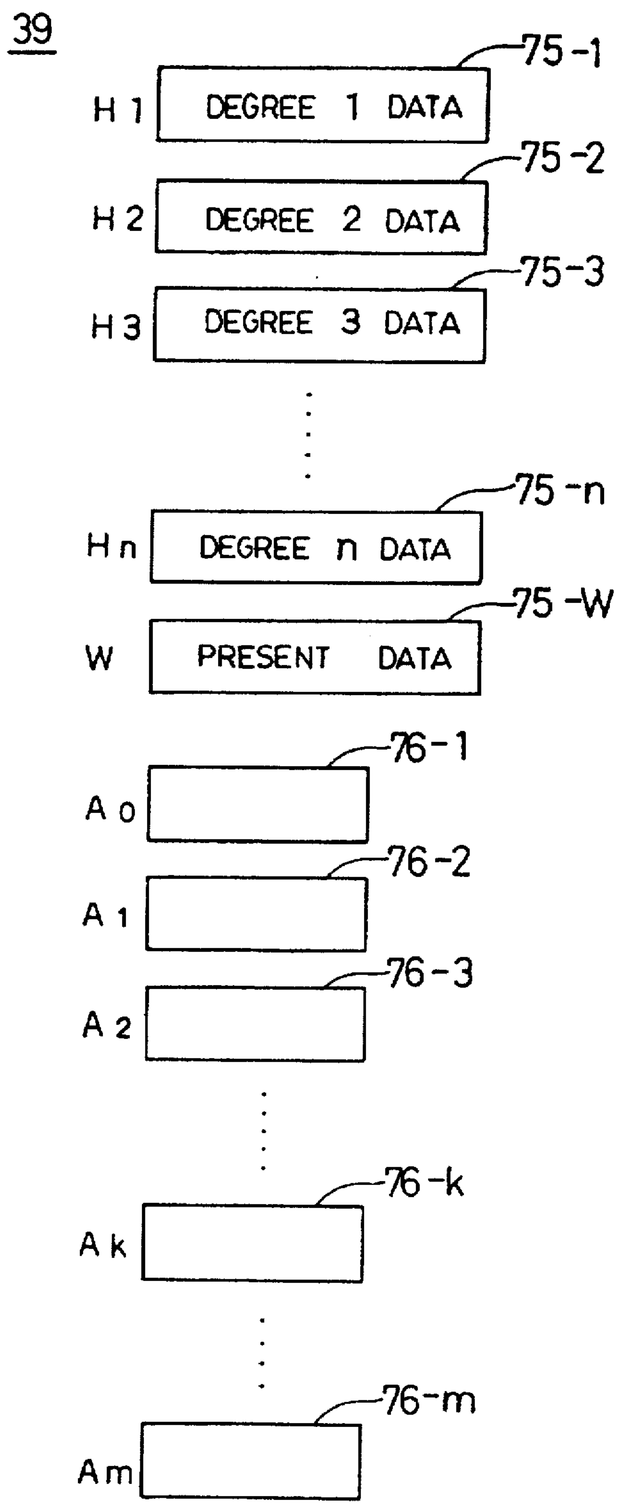
FIG. 28 is a diagram illustrating a group of registers used for the processing of filtering.

Groups of registers 75-1 to 75-n, 76-1, 76-2, 76-3, - - - for filtering processing shown in FIG. 28 are provided in the coefficient RAM 39 in the digital signal processor 11*c*. The delay data registers 75-1, 75-n store sampling data of sound data SD of original sound or reverberation sound data G, J. The delay data registers 75-1, 75-n store first to nth delay data H1 to Hn of the data SD, G and J. The first to n-th delay data H1 to Hn are obtained by multiplying the data SD, G and J by a attenuation coefficient Zn 1 to n times. The filter coefficient registers 76-1, 76-2, - - - , 76-m store A0, A1, - - - , Am. The filtering coefficients A0, A1, - - - , Am are those of the IIR-type digital filter. The n-th delay data Hn is a delay time of n times as long as the interrupting period.

First, the primary to n-th order delay data H1 to Hn are multiplied by filtering coefficients A0, A1, - - - , Ak shown on the left side of FIG. 27. There is thus found a sum of products of input sound data SD (G, J) and primary to n-th order delay data H1 to Hn (step 900). The input sound data SD (G, J) are those that are read out prior to starting the filtering processing. The results of operation of this product sum are the present data W. The present data W are stored in a present data register 75-W shown in FIG. 28 (step 900).

Next, the present data W and the primary to n-th order delay data H1 to Hn are multiplied by the filtering coefficients Ak to Am on the right side of FIG. 27 to find a sum of products (step 902). The results of operation of this product sum are sound data SD or reverberation sound data G, J. The sound data SD or the reverberation sound data G, J are output directly or after being multiplied by a coefficient Zn of attenuation through the steps 131 and 228 (steps 134, 232). Then, the data H1 to Hn in the delay data registers 75-1 to 75-n are shifted by 1. Finally, the present data W are input to the primary delay data H1 (steps 904 to 906). The above-mentioned processings are repeated after every interrupting period, thereby to execute the filtering processing.

28. Eleventh Embodiment

Figure 29:
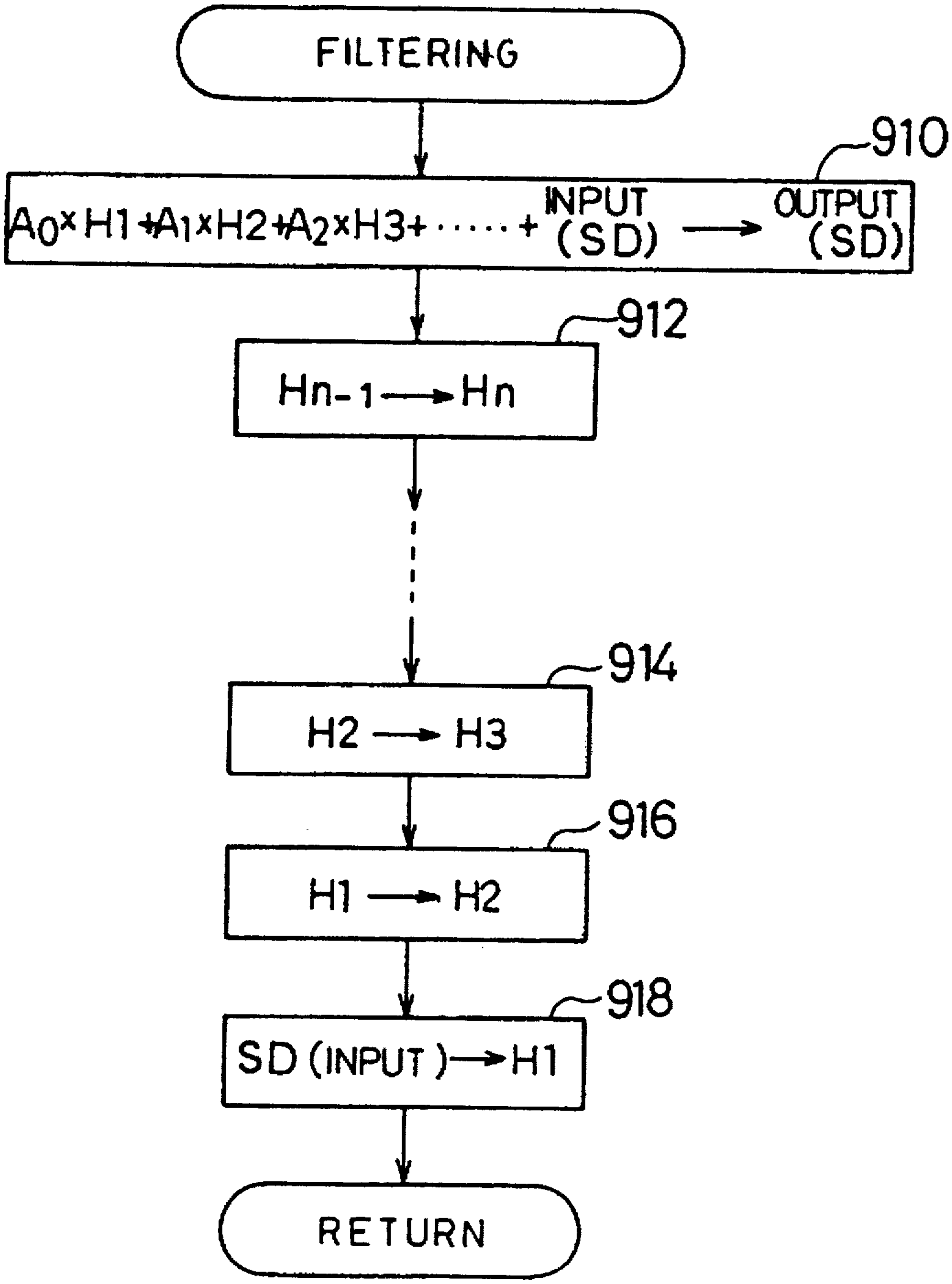
FIG. 29 is a flow chart illustrating another processing of filtering.
Figure 30:
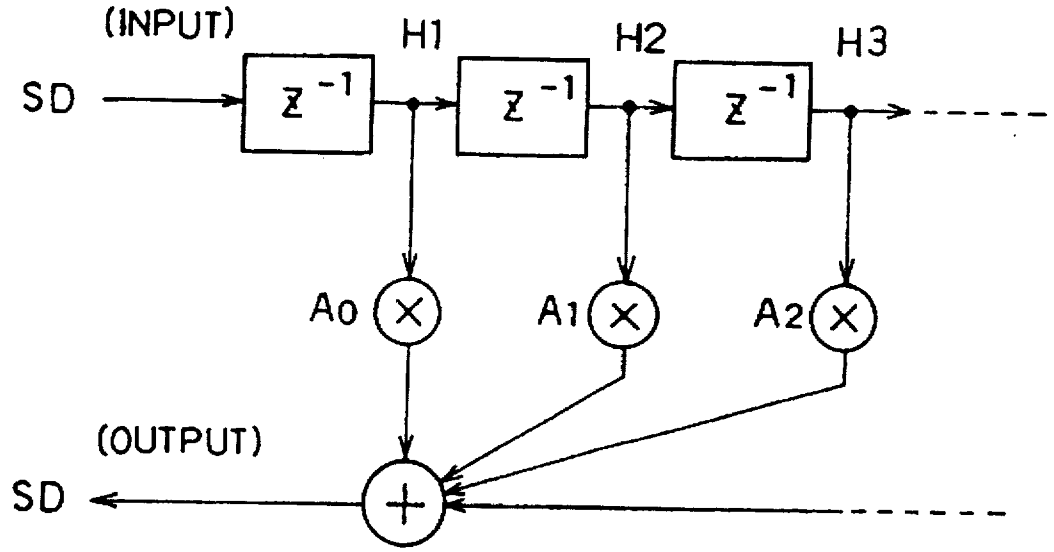
FIG. 30 is a diagram of an equivalent circuit for executing the processing of filtering shown in FIG. 29.

The IIR-type digital filter in the above-mentioned tenth embodiment is replaced by an FIR (Finite Impulse Response)-type digital filter. FIG. 29 is a flow chart illustrating the filtering processing using the FIR-type digital filter, and FIG. 30 is a diagram of an equivalent circuit for executing the filtering processing. This filtering processing is added after the step 126, 131 or 132 in the processing for producing reverberation sound shown in FIGS. 10 and 18. In the processing for producing reverberation sound shown in FIGS. 12 and 24, the filtering processing is added after the step 124, 131 or 132. In the processing for producing reverberation sound shown in FIGS. 14 and 25, the filtering processing is added after the step 220, 228 or 230.

First, the primary to n-th order delay data H1 to Hn are multiplied by the filtering coefficients A0 to Am. There is thus found a sum of products of the primary to n-th order delay data H1 to Hn and the input sound data SD (G, J) (step 910). The result of operation of the product sum is output directly or is multiplied by an attenuation coefficient Zn through the steps 131 and 228 (steps 134, 232). Then, the delay data Hn-1 to H1 of degrees lower by 1 are caused to migrate to the delay data Hn to H2 in the delay data registers 75-1 to 75-n (steps 912 to 916). Finally, the input sound data SD read out prior to starting the filtering processing is input to the primary delay data H1 (step 918). The above-mentioned processings are repeated after every interrupting period, thereby to execute the filtering processing.

The above-mentioned filtering processing can be adapted even to the processing for producing the early reflection sound. In this case, the filtering processing shown in FIG. 26 or 29 is added after the step 306 of the processing for producing the early reflection sound shown in FIGS. 9 and 17.

When the early reflection sound is produced (generated) by the processings of FIGS. 10, 12, 14, 18, 24 and 25, the filtering processing for the early reflection sound is the same as the filtering processing in the above-mentioned processing for producing the subsequent reverberation sound. In this case, the filtering coefficients A0, A1, - - - , Ak, - - - , Am used for the filtering processing for the early reflection sound may be different from, or may be the same as, the filtering coefficients A0, A1, - - - , Ak, - - - , Am used for the filtering processing for the subsequent reverberation sound. For instance, when the cut-off frequency of high frequency for the early reflection sound is higher than the cut-off frequency of high frequency for the subsequent reverberation sound, the early reflection sound contains much harmonic components.

The above-mentioned filtering processing may be executed at an independent interrupt timing which is different from the interrupt timing in the processing for producing the early reflection sound and in the processing for producing the subsequent reverberation sound. In this case, the period of interrupt signal is different from the period of interrupt signal in the processing for producing the early reflection sound and in the processing for producing the subsequent reverberation sound. This makes it possible to arbitrarily set the delay time Z-1. Therefore, the filtering characteristics change depending upon a change in the interrupting period.

Moreover, there may be separately provided a digital signal processor for executing the above-mentioned filtering processing only. In this case, the sound data SD or the reverberation sound data G, J output at the step 134 in FIGS. 10, 12, 18 and 24 or at the step 232 in FIGS. 14 and 25, are filtered by the above-mentioned digital signal processor that is separately provided. The sound data SD after filtering are output to the D-A converter 15. The output data of the early reflection sound are often subjected to the similar processing.

Not being limited to the above-mentioned embodiments only, the present invention can be modified in a variety of other ways without departing from the gist and scope of the invention. For instance, the number of the early reflection sounds that are to be produced (generated) may be one or may be three or more. Moreover, the subsequent reverberation sounds may be produced (generated) in one kind or in three or more kinds. TWo or more early reflection sounds may be produced (generated) by using a single digital signal processor.

Not being limited to producing the reverberation sounds of electronic musical instruments, furthermore, the present invention can be adapted to producing reverberation sounds in a variety of devices that control the sounds such as in an audio device, "karaoke" device, etc.

The aforementioned processings for producing the early reflection sounds and the subsequent reverberation sounds shown in FIGS. 7 to 25 can be replaced by other processing methods which may be those disclosed, for example, in the specifications and drawings of Japanese Patent Laid-Open No. 181598/1982, and Japanese Patent Applications Nos. 246900/1988, 314818/1989, 311840/1990. In this case, the circuits are provided in a plural number in parallel, or are formed (generated) in a plurality of sets relying upon the time-divisional processing. Besides, the contents of processing for producing the early reflection sounds are different from the contents of processing for producing the subsequent reverberation sounds, and different filtering processings are executed.

Moreover, the subsequent reverberation sounds may be produced (generated) in a plural number or in a number of one for one original sound. The attenuation processings such as of the steps 131, 306, 228, etc. may be executed before or after the delay processings of the steps 120 to 127, 300, 320, 220 and 222. Furthermore, the filtering processings may be executed before or after the attenuation processings or the delay processings.

The envelope shapes of the plurality of early reflection sounds and the subsequent reverberation sounds may be the same or different. The weighting data WT for the envelope levels of the plurality of early reflection sounds may have a correlation among the early reflection sounds, or may be independently determined.

The fluctuation data U may be formed (generated) in one kind or in a plurality of kinds. It is further allowable to use the fluctuation data U of different kind for every early reflection sound and subsequent reverberation sound. Two or more fluctuation data U may be combined together to form fluctuation data of a new kind. By using the combined fluctuation data, the fluctuation effect may be added to the early reflection sounds and to the subsequent reverberation sounds.

Moreover, the system for generating the fluctuation data can be replaced by a system disclosed in Japanese Patent Application No. 346063/1992 filed previously by the present applicant. The effect processings added to the early reflection sound or to the subsequent reverberation sound may be those which are carried out by modifying the frequencies and amplitudes such as envelope control, weighting, fluctuation effect, as well as bender, glide, portamento, tremolo, etc.

What is claimed is:

1. A device for producing reverberation sound comprising:

at least one early reflection sound producing means for delaying externally provided sound data and controlling amplitude levels of the sound data to produce early reflection sounds;

at least one early reflection sound control means for controlling said at least one early reflection sound producing means such that early reflection sounds are produced for every one sound data;

at least one subsequent reverberation sound producing means for delaying the sound data and controlling amplitude level of the sound data to produce subsequent reverberation sounds, the delaying by said at least one subsequent reverberation sound producing means being different from the delaying by said at least one early reflection sound producing means, and control of the amplitude level by said at least one subsequent reverberation sound producing means being different from control of the amplitude level by said at least one early reflection sound producing means; and at least one subsequent reverberation sound control means for controlling said at least one subsequent reverberation sound producing means such that plural subsequent reverberation sounds are produced for every one sound data, said at least one subsequent reverberation sound producing means having at least one sound storage means for storing the sound data for each sample, the sound data being transferred within said at least one sound storage means in accordance with a predetermined delay speed coefficient.

2. The device for producing reverberation sound according to claim 1, wherein said at least one early reflection sound producing means effects a filtering processing of the sound data and said at least one subsequent reverberation sound producing means effects a filtering processing of the sound data, the filtering processings being different from each other.

3. The device for producing reverberation sound according to claim 1, wherein the early reflection sounds have rates of attenuation, delay times, time zones for generating sound and frequency components which are different from those of the subsequent reverberation sounds.

4. The device for producing reverberation sound according to claim 1, wherein said at least one early reflection sound producing means comprises plural early reflection sound producing means, each of which produces one of the early reflection sounds.

5. The device for producing reverberation sound according to claim 1, wherein said at least one early reflection sound producing means comprises:

first address operation means for operating on, from an initial value toward a target value, addresses for storing sample data of the sound data stored in said at least one sound storage means;

first arrival discrimination means for discriminating whether the address operated on by said first address operation means has nearly arrived at the target value or not;

first sound reading means for reading the sample data of the sound data stored in said at least one sound storage means depending upon a result of discrimination by said first arrival discrimination means;

first early reflection sound output means for outputting, as early reflection sound data, the sample data of the sound data read out by said first sound reading means;

early reflection sound writing means for writing, into said at least one sound storage means, the sample data of the early reflection sound data output by said first early reflection sound output means;

second address operation means for operating on, from the initial value toward the target value, addresses for storing the sample data of the early reflection sound data stored in said at least one sound storage means by said early reflection sound writing means;

second arrival discrimination means for discriminating whether the address operated on by said second address operation means has nearly arrived at the target value or not;

second sound reading means for reading the sample data of the early reflection sound data stored in said at least one sound storage means depending upon a result of discrimination by said second arrival discrimination means; and second early reflection sound output means for outputting, as early reflection sound data, the sample data of the early reflection sound data read out by said second sound reading.

6. The device for producing reverberation sound according to claim 5, wherein said first an second address operation means operate on the addresses from the initial value toward the target value virtually.

7. The device for producing reverberation sound according to claim 5, wherein said first and second address operation means operate in advance a number of times of operation until the target value is arrived at from the initial value, and count the number of times of operation only, and said first and second arrival discrimination means discriminate that a present value of the address has arrived at the target value when the count has arrived at the number of times of operation.

8. The device for producing reverberation sound according to claim 1, wherein said at least one subsequent reverberation sound producing means comprises:

first address operation means for operating on, from an initial value toward a target value, addresses for storing sample data of the sound data stored in said at least one sound storage means;

first arrival discrimination means for discriminating whether the address operated on by said first address operation means has nearly arrived at the target value or not;

first sound reading means for reading the sample data of the sound data stored in said at least one sound storage means depending upon a result of discrimination by said first arrival discrimination means;

first reverberation sound output means for outputting, as reverberation sound data, the sample data of the sound data read out by said first sound reading means;

reverberation sound writing means for writing, into said at least one sound storage means, the sample data of the reverberation sound data output by said first reverberation sound output means;

second address operation means for operating on, from the initial value toward the target value, addresses for storing the sample data of the reverberation sound data stored in said at least one sound storage means by said reverberation sound writing means;

second arrival discrimination means for discriminating whether the address operated on by said second address operation means has nearly arrived at the target value or not;

second sound reading means for reading the sample data of the reverberation sound data stored in said at least one sound storage means depending upon a result of discrimination by said second arrival discrimination means; and second reverberation sound output means for outputting, as reverberation sound data, the sample data of the reverberation sound data read out by said second sound reading means.

9. The device for producing reverberation sound according to claim 8, wherein said first and second address operation means operate on the address from the initial value toward the target value virtually.

10. The device for producing reverberation sound according to claim 8, wherein said first and second address operation means operate in advance a number of times of operation until the target value is arrived at from the initial value, and count the number of times of operation only, and said first and second arrival discrimination means discriminate that a present value of the address has arrived at the target value when the count has arrived at the number of times of operation.

11. The device for producing reverberation sound according to claim 1, further comprising filtering means for filtering the sound data of early reflection sounds produced by said at least one early reflection sound producing means, before the sound data are output or while the sound data are being produced.

12. A device for producing reverberation sound comprising:

at least one early reflection sound producing means for delaying externally provided sound data and controlling amplitude levels of the sound data to produce early reflection sounds;

at least one early reflection sound control means for controlling said at least one early reflection sound producing means such that early reflection sounds are produced for every one sound data;

at least one subsequent reverberation sound producing means for delaying the sound data and controlling amplitude level of the sound data to produce subsequent reverberation sounds, the delaying by said at least one subsequent reverberation sound producing means being different from the delaying by said at least one early reflection sound producing means, and control of the amplitude level by said at least one subsequent reverberation sound producing means being different from control of the amplitude level by said at least one early reflection sound producing means;

at least one subsequent reverberation sound control means for controlling said at least one subsequent reverberation sound producing means such that plural subsequent reverberation sounds are produced for every one sound data; and at least one envelope control means for controlling envelopes of the early reflection sounds to be different from envelopes of the subsequent reverberation sounds.

13. The device for producing reverberation sound according to claim 12, wherein said at least one early reflection sound producing means effects a filtering processing of the sound data and said at least one subsequent reverberation sound producing means effects a filtering processing of the sound data, the filtering processings being different from each other.

14. The device for producing reverberation sound according to claim 12, wherein the early reflection sounds have rates of attenuation, delay times, time zones for generating sound and frequency components which are different from those of the subsequent reverberation sounds.

15. The device for producing reverberation sound according to claim 12, wherein said at least one early reflection sound producing means comprises plural early reflection sound producing means, each of which produces one of the early reflection sounds.

16. The device for producing reverberation sound according to claim 12, wherein said at least one early reflection sound producing means comprises:

at least one sound storage means for storing the sound data for each of samples;

first address operation means for operating on, from an initial value toward a target value, addresses for storing sample data of the sound data stored in said at least one sound storage means;

first arrival discrimination means for discriminating whether the address operated on by said first address operation means has nearly arrived at the target value or not;

first sound reading means for reading the sample data of the sound data stored in said at least one sound storage means depending upon a result of discrimination by said first arrival discrimination means;

first early reflection sound output means for outputting, as early reflection sound data, the sample data of the sound data read out by said first sound reading means;

early reflection sound writing means for writing, into said at least one sound storage means, the sample data of the early reflection sound data output by said first early reflection sound output means;

second address operation means for operating on, from the initial value toward the target value, addresses for storing the sample data of the early reflection sound data stored in said at least one sound storage means by said early reflection sound writing means;

second arrival discrimination means for discriminating whether the address operated on by said second address operation means has nearly arrived at the target value or not;

second sound reading means for reading the sample data of the early reflection sound data stored in said at least one sound storage means depending upon a result of discrimination by said second arrival discrimination means; and second early reflection sound output means for outputting, as early reflection sound data, the sample data of the early reflection sound data read out by said second sound reading means.

17. The device for producing reverberation sound according to claim 16, wherein said first and second address operation means operate on the addresses from the initial value toward the target value virtually.

18. The device for producing reverberation sound according to claim 16, wherein said first and second address operation means operate in advance a number of times of operation until the target value is arrived at from the initial value, and count the number of times of operation only, and said first and second arrival discrimination means discriminate that a present value of the address has arrived at the target value when the count has arrived at the number of times of operation.

19. The device for producing reverberation sound according to claim 12, wherein said at least one subsequent reverberation sound producing means comprises:

at least one sound storage means for storing the sound data for each of samples;

first address operation means for operating on, from an initial value toward a target value, addresses for storing sample data of the sound data stored in said at least one sound storage means;

first arrival discrimination means for discriminating whether the address operated on by said first address operation means has nearly arrived at the target value or not;

first sound reading means for reading the sample data of the sound data stored in said at least one sound storage means depending upon a result of discrimination by said first arrival discrimination means;

first reverberation sound output means for outputting, as reverberation sound data, the sample data of the sound data read out by said first sound reading means;

reverberation sound writing means for writing, into said at least one sound storage means, the sample data of the reverberation sound data output from said first reverberation sound output means;

second address operation means for operating on, from the initial value toward the target value, addresses for storing the sample data of the reverberation sound data stored in said at least one sound storage means by said reverberation sound writing means;

second arrival discrimination means for discriminating whether the address operated on by said second address operation means has nearly arrived at the target value or not;

second sound reading means for reading the sample data of the reverberation sound data stored in said at least one sound storage means depending upon a result of discrimination by said second arrival discrimination means; and second reverberation sound output means for outputting, as reverberation sound data, the sample data of the reverberation sound data read out by said second sound reading means.

20. The device for producing reverberation sound according to claim 19, wherein said first and second address operation means operate on the address from the initial value toward the target value virtually.

21. The device for producing reverberation sound according to claim 19, wherein said first and second address operation means operate in advance a number of times of operation until the target value is arrived at from the initial value, and count the number of times of operation only, and said first and second arrival discrimination means discriminate that a present value of the address has arrived at the target value when the count has arrived at the number of times of operation.

22. The device for producing reverberation sound according to claim 12, further comprising filtering means for filtering the sound data of early reflection sounds produced by said at least one early reflection sound producing means, before the sound data are output or while the sound data are being produced.

23. The device for producing reverberation sound according to claim 12, wherein a plurality of early reflection sounds are produced, the device for producing reverberation sound further comprising:

at least one weighting means for weighting envelope levels of the plurality of early reflection sounds controlled by said envelope control means.

24. The device for producing reverberation sound according to claim 12, further comprising at least one fluctuation effect-adding means for fluctuating the envelopes of the plurality of early reflection sounds controlled by said envelope control means.

25. A device for producing reverberation sound comprising:

at least one early reflection sound producing means for delaying externally provided sound data and controlling amplitude levels of the sound data to produce early reflection sounds;

at least one early reflection sound control means for controlling said at least one early reflection sound producing means such that early reflection sounds are produced for one every sound data;

at least one subsequent reverberation sound producing means for delaying the sound data and controlling amplitude level of the sound data to produce subsequent reverberation sounds, the delaying by said at least one subsequent reverberation sound producing means being different from the delaying by said at least one early reflection sound producing means, and control of the amplitude level by said at least one subsequent reverberation sound producing means being different from control of the amplitude level by said at least one early reflection sound producing means;

at least one subsequent reverberation sound control means for controlling said at least one subsequent reverberation sound producing means such that plural subsequent reverberation sounds are produced for every one sound data; and at least one envelope control means for controlling envelopes of the early reflection sounds and the subsequent reverberation sounds, and respectively changing control of the envelopes depending upon a number of times of reverberation.

* * * * *